(12) United States Patent
Kanno et al.

(10) Patent No.: US 12,236,106 B2
(45) Date of Patent: Feb. 25, 2025

(54) MEMORY SYSTEM AND METHOD OF CONTROLLING NONVOLATILE MEMORY

(71) Applicant: Kioxia Corporation, Tokyo (JP)

(72) Inventors: Shinichi Kanno, Ota (JP); Yuki Sasaki, Kamakura (JP)

(73) Assignee: Kioxia Corporation, Tokyo (JP)

( * ) Notice: Subject to any disclaimer, the term of this patent is extended or adjusted under 35 U.S.C. 154(b) by 139 days.

(21) Appl. No.: 17/941,388

(22) Filed: Sep. 9, 2022

(65) Prior Publication Data

US 2023/0297247 A1   Sep. 21, 2023

(30) Foreign Application Priority Data

Mar. 16, 2022 (JP) ................................ 2022-041509

(51) Int. Cl.
    *G06F 3/06* (2006.01)
(52) U.S. Cl.
    CPC .......... *G06F 3/0619* (2013.01); *G06F 3/0659* (2013.01); *G06F 3/0679* (2013.01)
(58) Field of Classification Search
    CPC ........ G06F 3/0619; G06F 3/059; G06F 3/079; G06F 12/0246; G06F 3/0679; G06F 2212/7203; G06F 12/0868; G06F 3/0656; G06F 2212/7201; G06F 2212/2022; G06F 2212/214
    See application file for complete search history.

(56) References Cited

U.S. PATENT DOCUMENTS

| | | | |
|---|---|---|---|
| 10,552,311 B2 | 2/2020 | Edgington et al. | |
| 11,435,799 B2 * | 9/2022 | Kojima | G06F 12/0246 |
| 11,561,724 B2 * | 1/2023 | Troy | G06F 3/0659 |
| 11,693,592 B2 * | 7/2023 | Miomo | G06F 1/206 |
| | | | 711/101 |
| 2017/0242822 A1 | 8/2017 | Malladi et al. | |
| 2017/0277452 A1 * | 9/2017 | Joshi | G06F 3/0679 |
| 2018/0267827 A1 * | 9/2018 | Kanno | G06F 3/065 |
| 2018/0356998 A1 * | 12/2018 | Wu | G06F 12/0246 |
| 2020/0272604 A1 | 8/2020 | Chang et al. | |
| 2020/0371571 A1 * | 11/2020 | Kojima | G06F 1/263 |
| 2021/0303199 A1 * | 9/2021 | Horspool | G06F 3/0614 |

(Continued)

FOREIGN PATENT DOCUMENTS

| | | |
|---|---|---|
| JP | 2010-097386 A | 4/2010 |
| JP | 4661369 B2 | 3/2011 |

(Continued)

*Primary Examiner* — Francisco A Grullon
(74) *Attorney, Agent, or Firm* — Oblon, McClelland, Maier & Neustadt, L.L.P.

(57) ABSTRACT

According to one embodiment, a controller of a memory system writes, in response to receiving from the host a write command specifying a logical address, data received from the host to a first write destination block. The controller manages a first list and first storage location information, the first list including a plurality of logical addresses corresponding respectively to write-uncompleted data, and the first storage location information indicating a storage location at a beginning of a write-uncompleted region in the first write destination block. In a case where a power loss has occurred without notice from the host, the controller writes the first list and the first storage location information to the nonvolatile memory using power from a capacitor.

20 Claims, 13 Drawing Sheets

(56) References Cited

U.S. PATENT DOCUMENTS

| | | | |
|---|---|---|---|
| 2021/0382828 A1* | 12/2021 | Li | G06F 12/1009 |
| 2022/0035552 A1* | 2/2022 | Jain | G06F 3/0619 |
| 2022/0187992 A1* | 6/2022 | Malakapalli | G06F 3/065 |
| 2022/0300182 A1* | 9/2022 | Esaka | G06F 3/0611 |
| 2023/0044942 A1* | 2/2023 | Tomlin | G06F 3/0608 |

FOREIGN PATENT DOCUMENTS

| | | |
|---|---|---|
| TW | 201732611 A | 9/2017 |
| TW | 202103155 A | 1/2021 |

\* cited by examiner

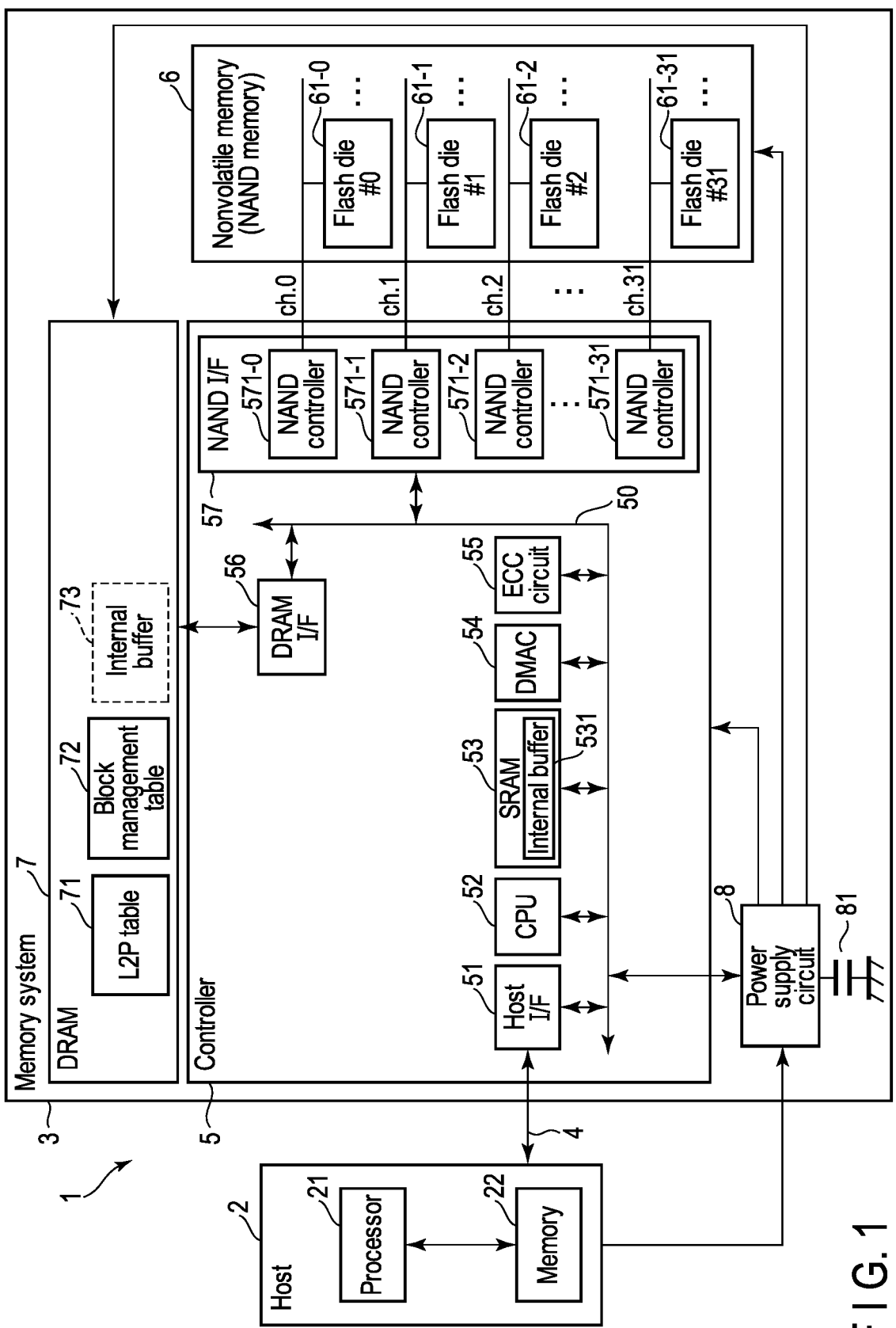
F I G. 1

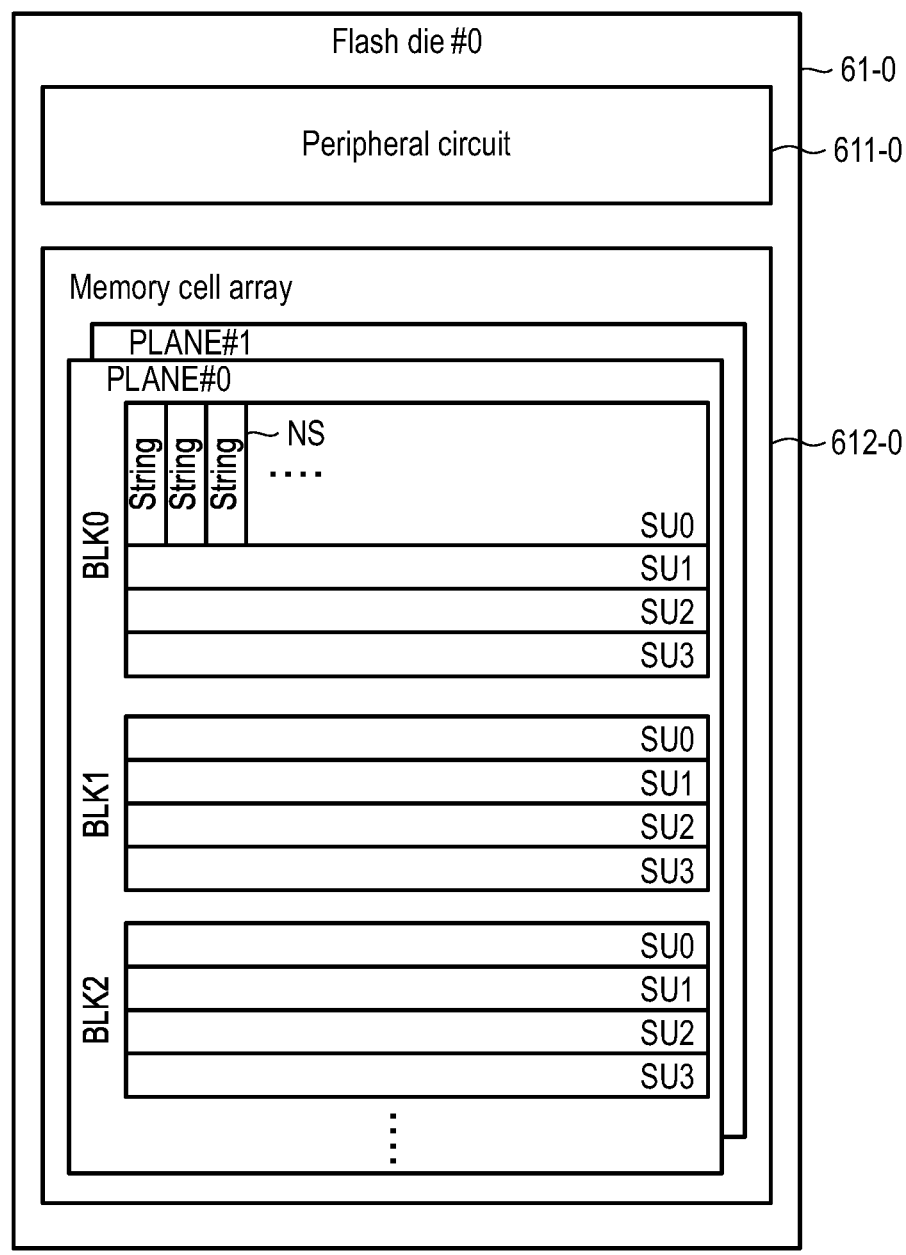
F I G. 2

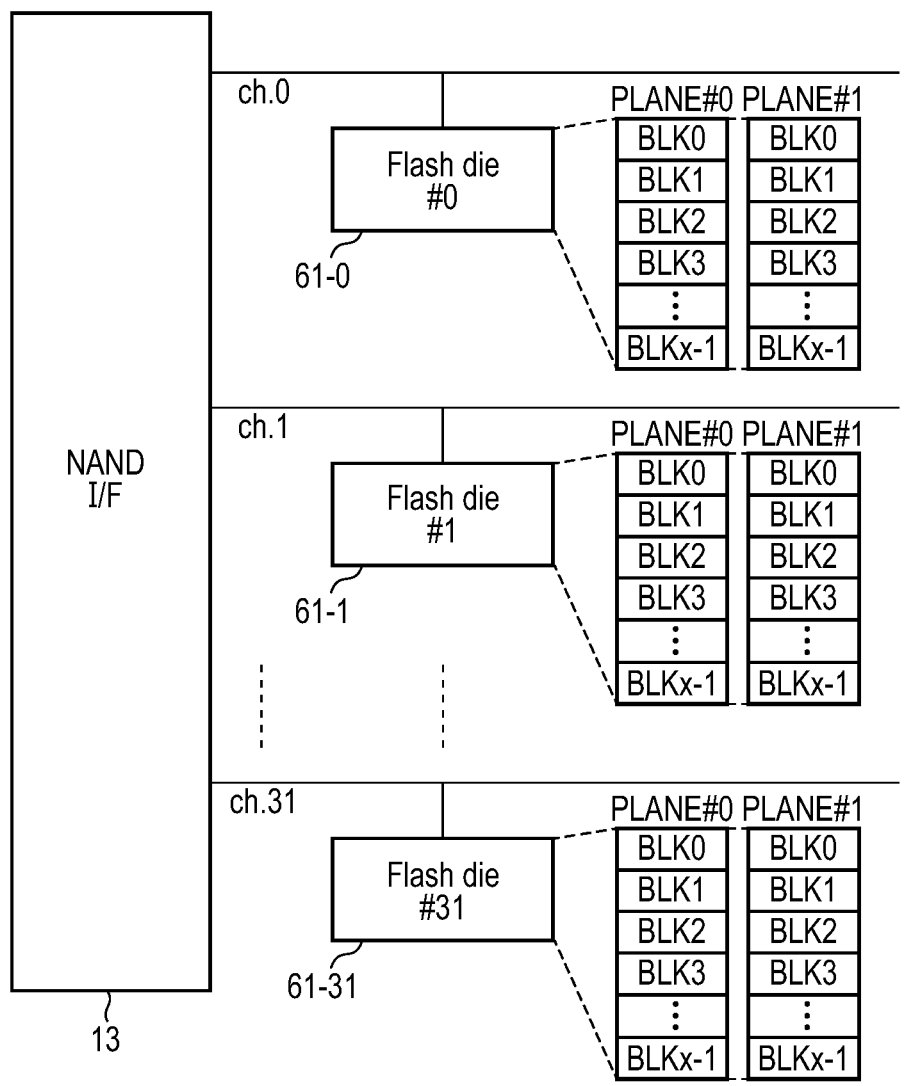
F I G. 4

SB0

BLK0 (PLANE#0)

| | | SU0 | | | | SU1 | | | | SU2 | | | | SU3 | | | |
|---|---|---|---|---|---|---|---|---|---|---|---|---|---|---|---|---|---|
| WL0 | lower | +0 (4KB) | +1 (4KB) | +2 (4KB) | +3 (4KB) | +32 (4KB) | +33 (4KB) | +34 (4KB) | +35 (4KB) | +64 (4KB) | +65 (4KB) | +66 (4KB) | +67 (4KB) | +96 (4KB) | +97 (4KB) | +98 (4KB) | +99 (4KB) |
| | middle | +4 (4KB) | +5 (4KB) | +6 (4KB) | +7 (4KB) | +36 (4KB) | +37 (4KB) | +38 (4KB) | +39 (4KB) | +68 (4KB) | +69 (4KB) | +70 (4KB) | +71 (4KB) | +100 (4KB) | +101 (4KB) | +102 (4KB) | +103 (4KB) |
| | upper | +8 (4KB) | +9 (4KB) | +10 (4KB) | +11 (4KB) | +40 (4KB) | +41 (4KB) | +42 (4KB) | +43 (4KB) | +72 (4KB) | +73 (4KB) | +74 (4KB) | +75 (4KB) | +104 (4KB) | +105 (4KB) | +106 (4KB) | +107 (4KB) |
| | higher | +12 (4KB) | +13 (4KB) | +14 (4KB) | +15 (4KB) | +44 (4KB) | +54 (4KB) | +46 (4KB) | +47 (4KB) | +76 (4KB) | +77 (4KB) | +78 (4KB) | +79 (4KB) | +108 (4KB) | +109 (4KB) | +110 (4KB) | +111 (4KB) |
| WL1 | lower | +128 (4KB) | +129 (4KB) | +130 (4KB) | +131 (4KB) | | | | | | | | | | | | |
| | middle | +132 (4KB) | +133 (4KB) | +134 (4KB) | +135 (4KB) | | | | | | | | | | | | |
| | upper | +136 (4KB) | +137 (4KB) | +138 (4KB) | +139 (4KB) | | | | | | | | | | | | |
| | higher | +140 (4KB) | +141 (4KB) | +142 (4KB) | +143 (4KB) | | | | | | | | | | | | |

BLK0 (PLANE#1)

| | | SU0 | | | | SU1 | | | | SU2 | | | | SU3 | | | |
|---|---|---|---|---|---|---|---|---|---|---|---|---|---|---|---|---|---|
| WL0 | lower | +16 (4KB) | +17 (4KB) | +18 (4KB) | +19 (4KB) | +48 (4KB) | +49 (4KB) | +50 (4KB) | +51 (4KB) | +80 (4KB) | +81 (4KB) | +82 (4KB) | +83 (4KB) | +112 (4KB) | +113 (4KB) | +114 (4KB) | +115 (4KB) |
| | middle | +20 (4KB) | +21 (4KB) | +22 (4KB) | +23 (4KB) | +52 (4KB) | +53 (4KB) | +54 (4KB) | +55 (4KB) | +84 (4KB) | +85 (4KB) | +86 (4KB) | +87 (4KB) | +116 (4KB) | +117 (4KB) | +118 (4KB) | +119 (4KB) |
| | upper | +24 (4KB) | +25 (4KB) | +26 (4KB) | +27 (4KB) | +56 (4KB) | +57 (4KB) | +58 (4KB) | +59 (4KB) | +88 (4KB) | +89 (4KB) | +90 (4KB) | +91 (4KB) | +120 (4KB) | +121 (4KB) | +122 (4KB) | +123 (4KB) |
| | higher | +28 (4KB) | +29 (4KB) | +30 (4KB) | +31 (4KB) | +60 (4KB) | +61 (4KB) | +62 (4KB) | +63 (4KB) | +92 (4KB) | +93 (4KB) | +94 (4KB) | +95 (4KB) | +124 (4KB) | +125 (4KB) | +126 (4KB) | +127 (4KB) |
| WL1 | lower | +144 (4KB) | +145 (4KB) | +146 (4KB) | +147 (4KB) | | | | | | | | | | | | |
| | middle | +148 (4KB) | +149 (4KB) | +150 (4KB) | +151 (4KB) | | | | | | | | | | | | |
| | upper | +152 (4KB) | +153 (4KB) | +154 (4KB) | +155 (4KB) | | | | | | | | | | | | |
| | higher | +156 (4KB) | +157 (4KB) | +158 (4KB) | +159 (4KB) | | | | | | | | | | | | |

F I G. 5

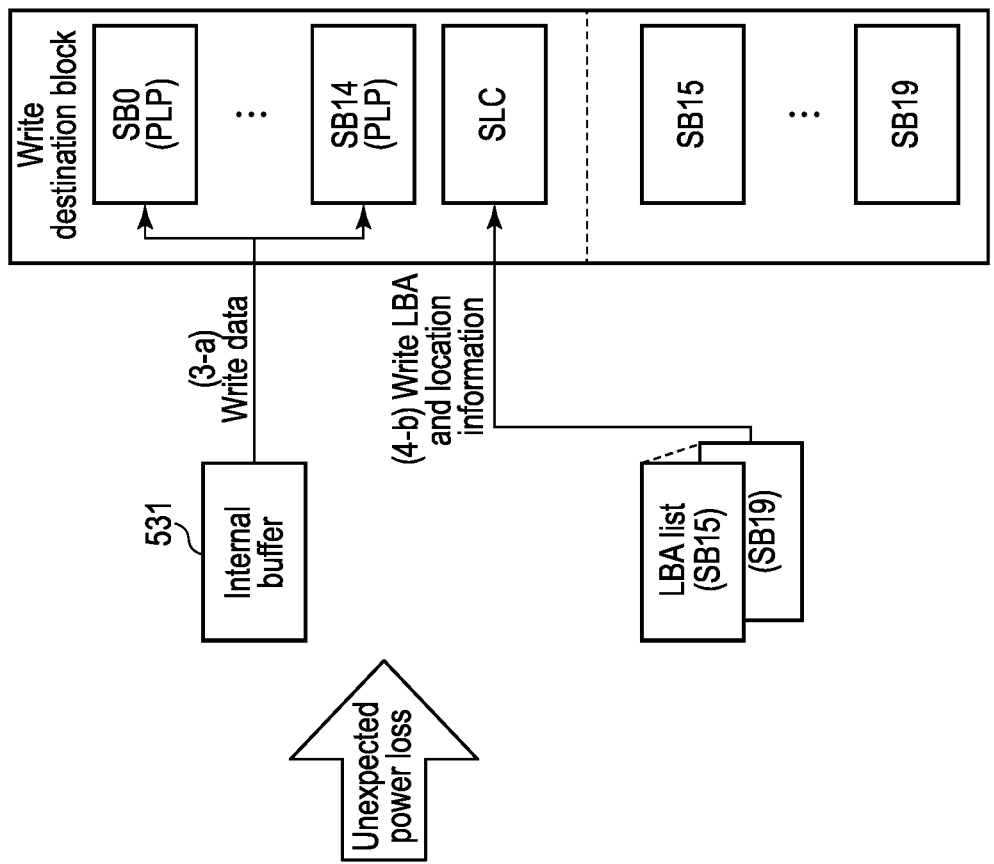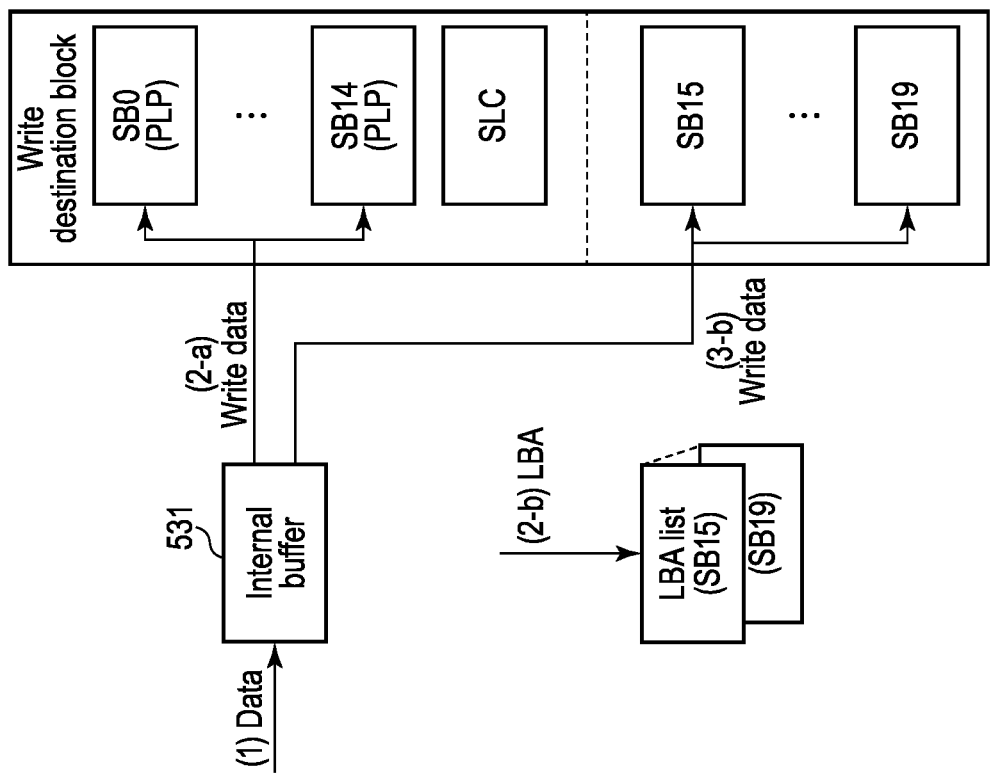
F I G. 6

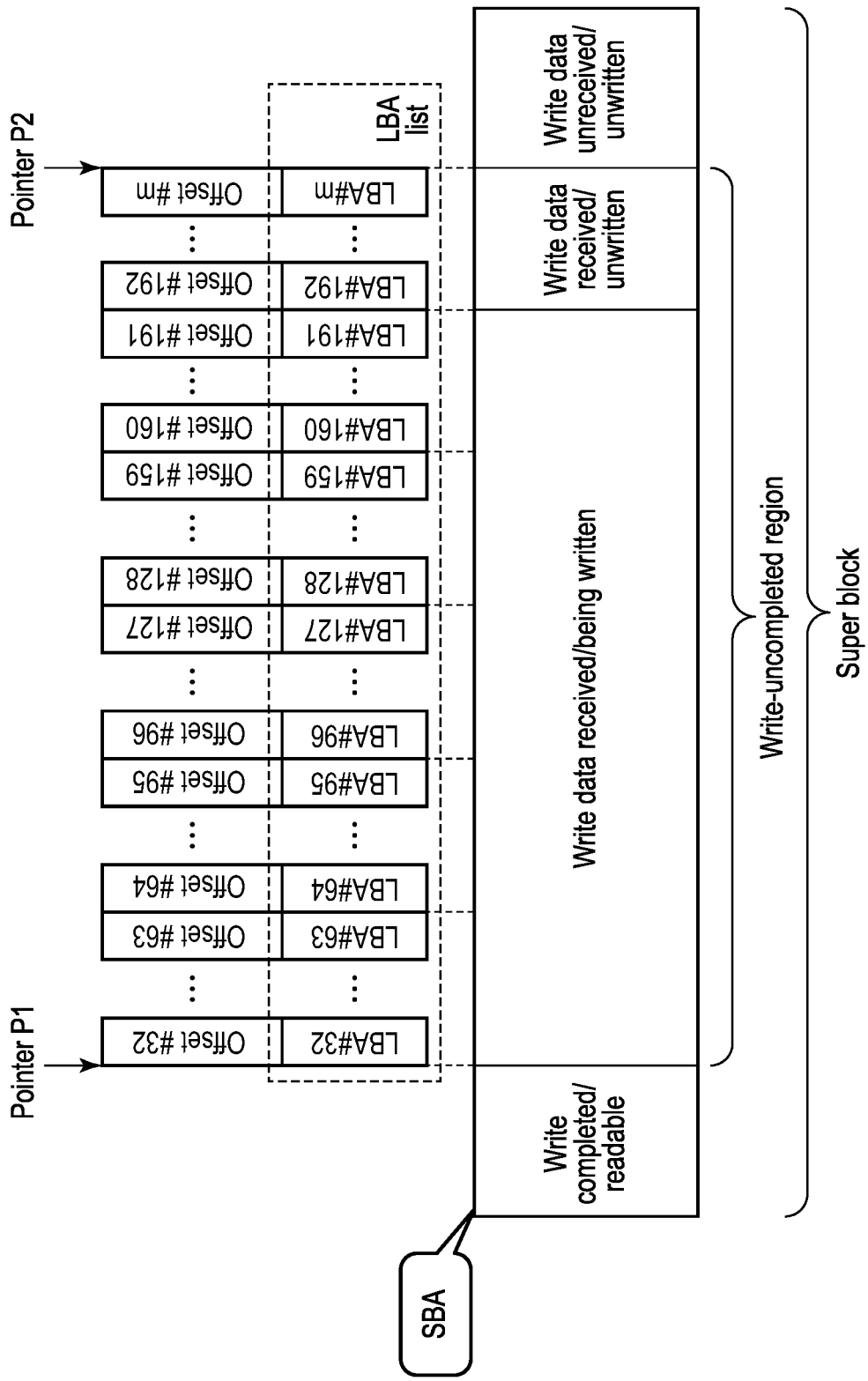
F I G. 8

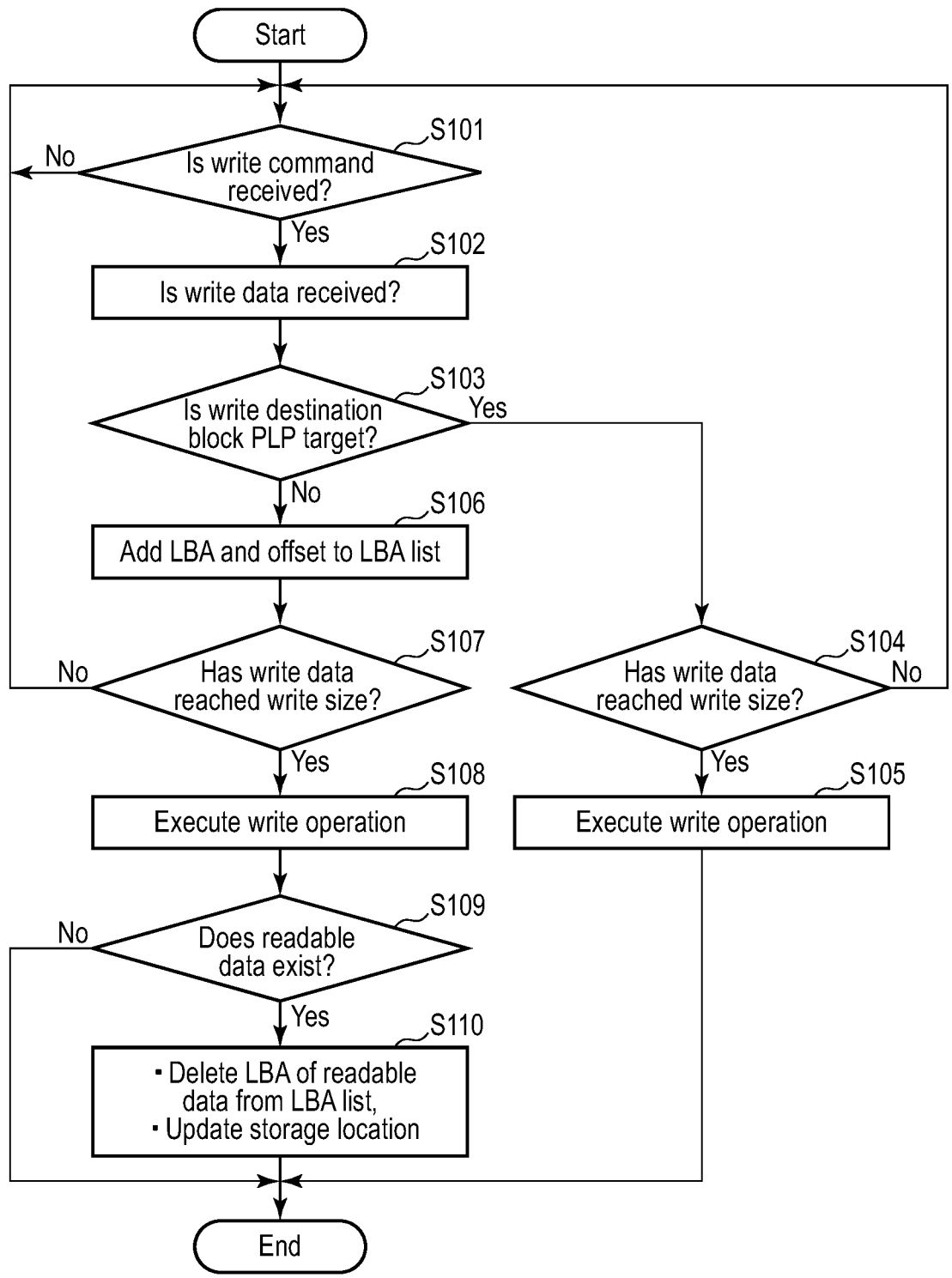
F I G. 10

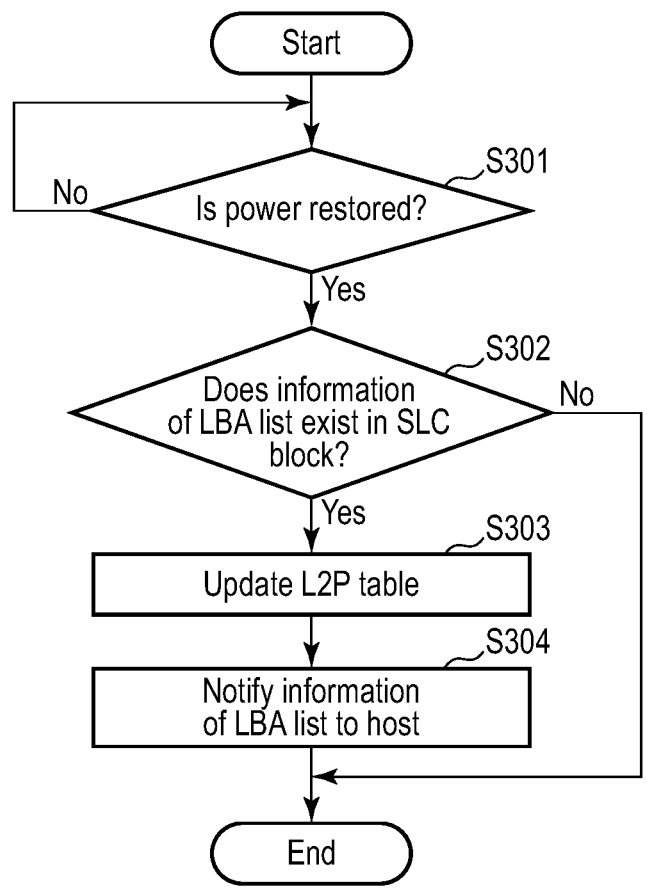
F I G. 12

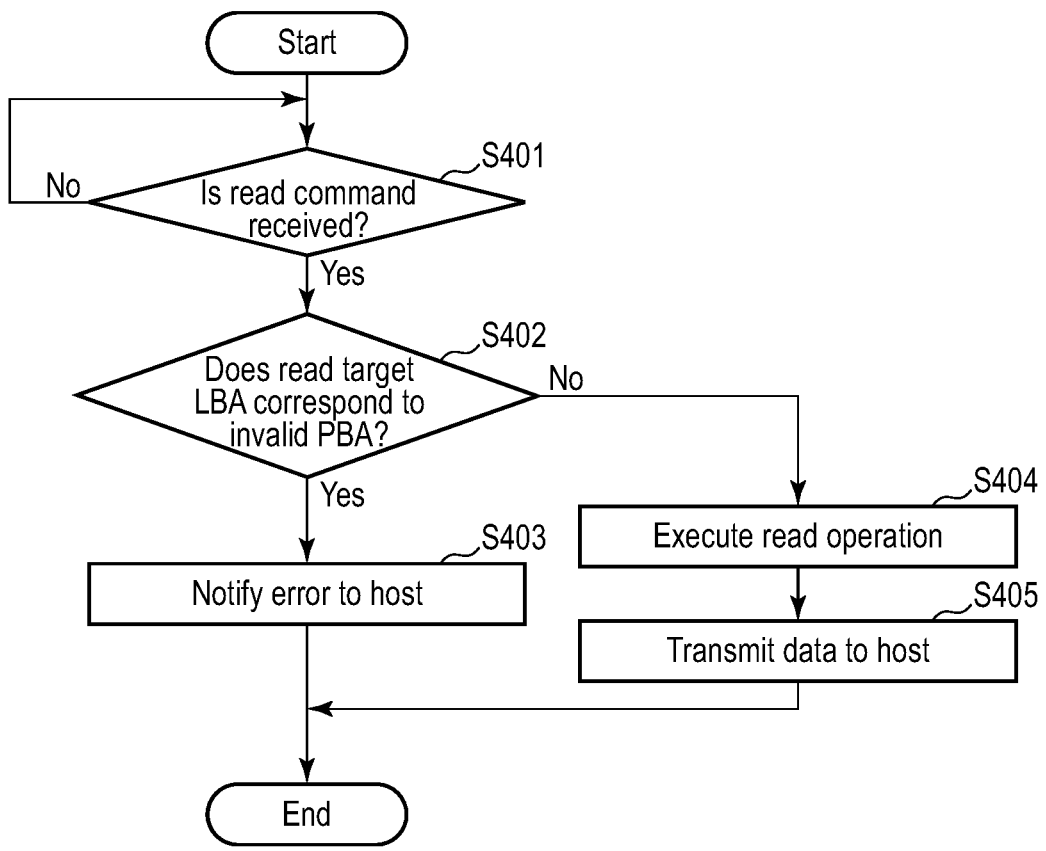
F I G. 13

MEMORY SYSTEM AND METHOD OF CONTROLLING NONVOLATILE MEMORY

CROSS-REFERENCE TO RELATED APPLICATIONS

This application is based upon and claims the benefit of priority from Japanese Patent Application No. 2022-041509, filed Mar. 16, 2022, the entire contents of which are incorporated herein by reference.

FIELD

Embodiments described herein relate generally to a memory system and a methods of controlling a nonvolatile memory.

BACKGROUND

In recent years, memory systems equipped with a nonvolatile memory have become widely used. As such memory systems, a solid state drive (SSD) that includes a NAND flash memory is known.

In memory systems such as SSDs, a power loss protection function (also referred to as a PLP function) is sometimes used to deal with an unexpected power loss.

The power loss protection function is a function of writing unwritten data (write-uncompleted data) stored in a buffer to the nonvolatile memory by using electric power stored in a capacitor.

However, the amount of data that can be written to the nonvolatile memory using the electric power stored in the capacitor is limited to a certain upper limit. Therefore, in a case where the amount of write-uncompleted data is large, a part of the write-uncompleted data may be lost.

BRIEF DESCRIPTION OF THE DRAWINGS

FIG. 1 is a block diagram illustrating an example of a configuration of an information processing system that includes a memory system according to an embodiment.

FIG. 2 is a block diagram illustrating an example of a configuration of a NAND flash memory die included in the memory system according to the embodiment.

FIG. 4 is a block diagram illustrating an example of a relationship between a plurality of channels and a plurality of NAND flash memory dies used in the memory system according to the embodiment.

FIG. 5 is a diagram illustrating an example of a configuration of a super block used in the memory system according to the embodiment, and an example of a relationship between each of a plurality of storage locations included in the super block and each of a plurality of offsets corresponding to the storage locations included in the super block.

FIG. 6 is a diagram illustrating an example of a write operation for a write destination block and a power loss protection (PLP) operation, which are executed in the memory system according to the embodiment.

FIG. 8 is a diagram illustrating another example of the relationship between the write destination block and the LBA list managed in the memory system according to the embodiment.

FIG. 10 is a flowchart illustrating a procedure of a data write operation executed in the memory system according the embodiment.

FIG. 12 is a flowchart illustrating a procedure of an LBA notification operation executed in the memory system according to the embodiment.

FIG. 13 is a flowchart illustrating a procedure of a data read operation executed in the memory system according to the embodiment.

DETAILED DESCRIPTION

Figure 3:
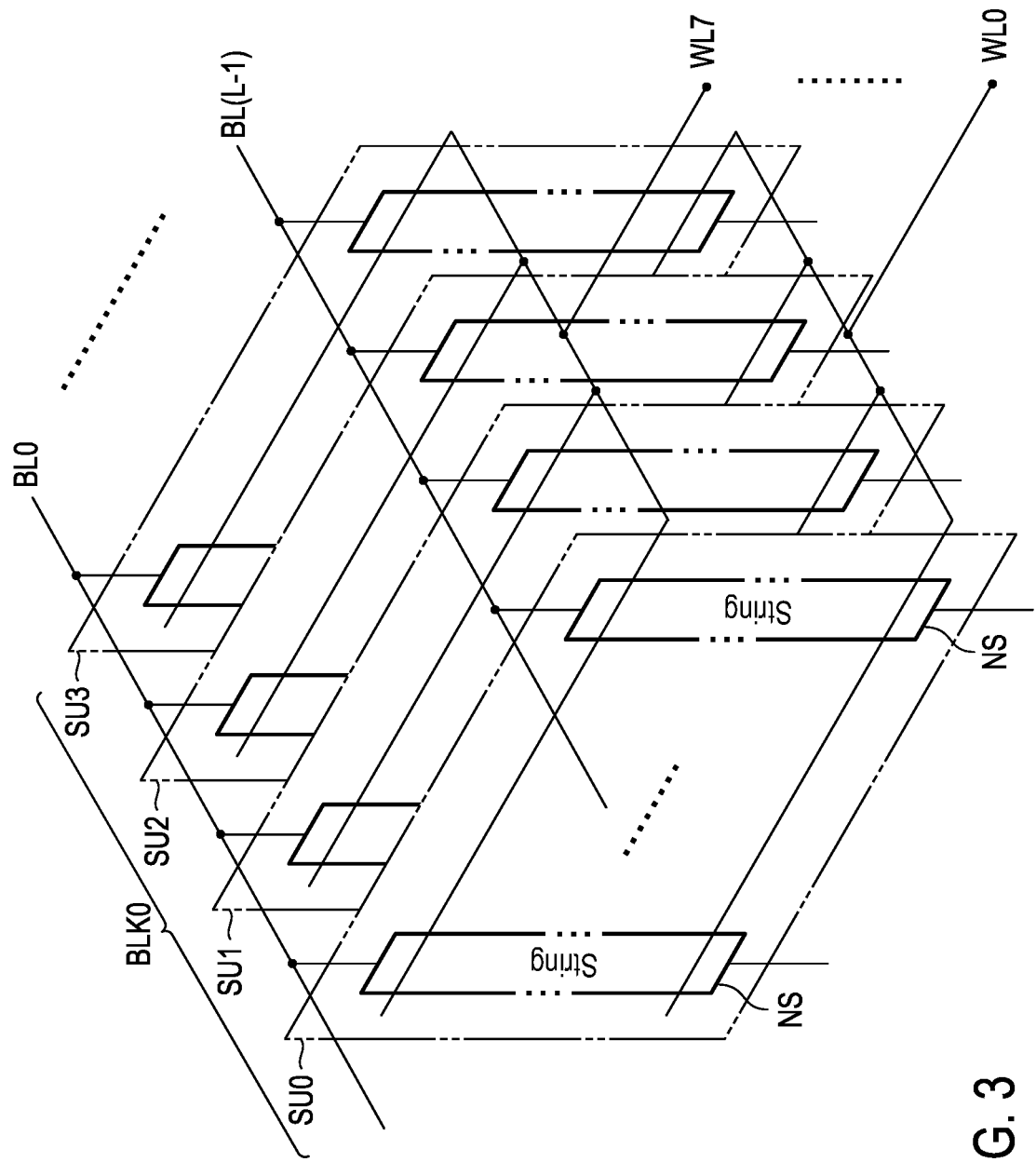
FIG. 3 is a diagram illustrating an example of a configuration of a block of a NAND flash memory included in the memory system according to the embodiment.

Various embodiments will be described hereinafter with reference to the accompanying drawings.

In general, according to one embodiment, a memory system is connectable to a host. The memory system comprises a nonvolatile memory and a controller. The nonvolatile memory includes a plurality of blocks. The controller is configured to write, in response to receiving from the host a write command specifying a logical address, data received from the host to a first write destination block allocated from the plurality of blocks. The controller manages a first list and first storage location information, the first list including a plurality of logical addresses corresponding respectively to write-uncompleted data that have been received from the host and have not been written to the first write destination block, and the first storage location information indicating a storage location at a beginning of a write-uncompleted region in the first write destination block for which writing of data has not been completed. In a case where a power loss occurs in which supply of power to the memory system is shut off without notice from the host, the controller writes the first list and the first storage location information to the nonvolatile memory using power from a capacitor that stores power to be supplied to the memory system.

FIG. 1 is a block diagram illustrating an example of a configuration of an information processing system 1 that includes a memory system 3 according to an embodiment. The memory system 3 according to the embodiment is a storage device that includes a nonvolatile memory 6.

The information processing system 1 includes a host (host device) 2 and the memory system 3. The host 2 and the memory system 3 can be connected via a bus 4.

The host 2 is an information processing apparatus. The host 2 is, for example, a personal computer or a server computer. The host 2 accesses the memory system 3. Specifically, the host 2 transmits a write command, which is a command for writing data, to the memory system 3. The host 2 also transmits a read command, which is a command for reading data, to the memory system 3.

The memory system 3 is a semiconductor storage device. The memory system 3 is, for example, a solid state drive (SSD). The memory system 3 includes the nonvolatile memory 6. The memory system 3 writes data to the nonvolatile memory 6. The memory system 3 then reads data from the nonvolatile memory 6.

The bus 4 is, for example, a bus compliant with the PCI Express™ (PCIe™) standard. The bus 4 is a transmission path connecting the host 2 and the memory system 3. The bus 4 is used to transmit data and input/output (I/O) commands from the host 2 to the memory system 3 and to transmit data and responses from the memory system 3 to the host 2. The I/O command is a command for writing to the nonvolatile memory 6 or reading data from the nonvolatile memory 6. The I/O command includes a write command and a read command.

Next, an internal configuration of the host 2 will be described. The host 2 includes a processor 21 and a memory 22.

The processor 21 is, for example, a central processing unit (CPU). The processor 21 communicates with the memory system 3 via the bus 4. The processor 21 executes software (host software) that is loaded into the memory 22 from the memory system 3 or other storage device connected to the host 2. The host software includes an operating system, a file system, a device driver, or an application program.

The memory 22 is, for example, a volatile memory. The memory 22 is, for example, a dynamic random access memory (DRAM).

Next, an internal configuration of the memory system 3 will be described. The memory system 3 includes a controller 5 and the nonvolatile memory 6. An example of the nonvolatile memory 6 is a NAND flash memory. In the following, the nonvolatile memory 6 is referred to as a NAND memory 6.

The controller 5 is a memory controller. The controller 5 is a semiconductor device such as a System-on-a-Chip (SoC). The controller 5 is electrically connected to the NAND memory 6. The controller 5 writes and reads data to and from the NAND memory 6. The controller 5 also executes communication with the host 2 via the bus 4. For example, as a physical interface connecting the controller 5 and the NAND memory 6, a toggle NAND flash interface or an open NAND flash interface (ONFI) is used. The functions of each unit of the controller 5 can be realized by dedicated hardware, a processor executing a program, or a combination thereof.

The NAND memory 6 is, for example, a flash memory with a two-dimensional structure or a three-dimensional structure. The NAND memory 6 includes a plurality of blocks. Each of the plurality of blocks is the smallest unit for erasing data stored in the NAND memory 6, that is, a unit of performing data erase operation.

The memory system 3 may include a dynamic random access memory (DRAM) 7 in addition to the controller 5 and the nonvolatile memory 6. The DRAM 7 is a volatile memory. A part of a memory region of the DRAM 7 may be used as, for example, an internal buffer 73 that temporarily stores the write data received from the host 2 or the read data read from the NAND memory 6.

The memory system 3 further includes a power supply circuit 8. The power supply circuit 8 is a power supply control circuit. For example, the power supply circuit 8 receives power which is supplied from the host 2, and supplies power to each component of the memory system 3, such as the controller 5, the NAND memory 6, and the DRAM 7.

Next, an internal configuration of the controller 5 will be described. The controller 5 includes a host interface (host I/F) 51, a CPU 52, a static RAM (SRAM) 53, a direct memory access controller (DMAC) 54, an error checking and correction (ECC) circuit 55, a DRAM interface (DRAM I/F) 56, and a NAND interface (NAND I/F) 57. Each or these units in the controller 5 is interconnected via an internal bus 50. The power is also supplied to this internal bus 50 from the power supply circuit 8.

The host interface 51 is a hardware interface circuit. The host interface 51 executes communication with the host 2. For example, the host interface 51 receives I/O commands from the host 2. The host interface 51 also transmits responses for the received I/O commands to the host 2.

The CPU 52 is a processor. The CPU 52 controls the host interface 51, the SRAM 53, the DMAC 54, the ECC circuit 55, the DRAM interface 56, and the NAND interface 57. The CPU 52 loads a control program (firmware) stored in the NAND memory 6 or a ROM (not shown) into the SRAM 53, and performs various processes by executing the firmware. Note that the firmware may also be loaded into the DRAM 7.

The CPU 52, for example, as a flash translation layer (FTL), manages the data stored in the NAND memory 6 and manages the blocks included in the NAND memory 6. The management of the data stored in the NAND memory 6 includes, for example, the management of mapping information indicating the correspondence between each of logical addresses and each of physical addresses. The logical address is the address used by the host 2 to access the NAND memory 6. The logical address is, for example, a logical block address (LBA). The physical address is an address indicating a physical storage location included in the NAND memory 6. The CPU 52 manages the mapping between each of the logical addresses and each of the physical addresses by using a logical-to-physical translation table (L2P table) 71. Furthermore, the management of the blocks included in the NAND memory 6 includes, for example, garbage collection, management of defective blocks (bad blocks), and wear leveling. The CPU 52 manages the blocks included in the NAND memory 6 by using a block management table 72.

The SRAM 53 is a volatile memory. The SRAM 53 is used, for example, as a work area for the CPU 52. The SRAM 53 also includes an internal buffer 531. The internal buffer 531 is a memory region that temporarily stores data associated with write commands received from the host 2.

The DMAC 54 is a circuit that executes direct memory access (DMA). The DMAC 54 executes data transfer between the memory 22 of the host 2 and the DRAM 7 or the SRAM 53.

The ECC circuit 55 is a circuit that executes data encoding and data decoding. The ECC circuit 55 executes encode processing when writing data to the NAND memory 6. In the encode processing, the ECC circuit 55 adds ECC parity as a redundancy code to the data to be written. The ECC circuit 55 executes decode processing using the ECC parity added to the data read from the NAND memory 6. In the decode processing, the ECC circuit 55 corrects errors in the read data.

The DRAM interface 56 is a circuit that controls the DRAM 7. The DRAM interface 56 writes data to the DRAM 7. The DRAM interface 56 also reads data stored in the DRAM 7.

The NAND interface 57 is a circuit that controls the NAND memory 6. The NAND interface 57 includes, for example, NAND controllers 571-0, 571-1, 571-2, . . . , and 571-31. Each of the NAND controllers 571-0, 571-1, 571-2, . . . , and 571-31 is connected to one or more flash dies included in the NAND memory 6 via a corresponding one channel among channels ch0, ch1, ch2, . . . , and ch31. The flash die is also referred to as a flash chip. The NAND controllers 571-0, 571-1, 571-2, . . . , and 571-31 control, for example, a flash die (#0) 61-0, a flash die (#1) 61-1, ..., and a flash die (#31) 61-31, respectively.

Next, information stored in the DRAM 7 will be described. The information stored in the DRAM 7 includes the L2P table 71 and the block management table 72. A part or all of the L2P table 71 and the block management table 72 may be stored in the SRAM 53 instead of the DRAM 7.

The L2P table 71 manages the mapping between each of the logical addresses and each of physical addresses in units of a given size, such as sectors.

The block management table 72 manages each of the blocks contained in the NAND memory 6. The block management table 72 manages, for example, whether each block is available or not. The block management table 72 may also manage whether or not each block is a target of a power loss protection operation.

The memory system 3 further includes a capacitor 81. The capacitor 81 is an element capable of storing power (electric power). The capacitor 81 is electrically connected to the power supply circuit 8. The power supply circuit 8 supplies power stored in the capacitor 81 to each component of the memory system 3 in a case where a value of the power supply voltage supplied from the host 2 drops without notice from the host 2. The power stored in the capacitor 81 can be used, for example, for the controller 5 to perform an LBA list save operation.

Next, the LBA list save operation executed by the controller 5 will be described. The LBA list save operation is executed to identify data lost due to an unexpected power loss. An unexpected power loss is a phenomenon in which supply of power to the memory system 3 is shut off without notice from the host 2 (power shutoff advance notification). The power shutoff advance notification notifies that supply of power to the memory system 3 will be shut off. Before the power of the host 2 is turned off, the host 2 transmits the power shutoff advance notification to the memory system 3 to notify the memory system 3 that supply of power supply to the memory system 3 will be shut off soon. The power shutoff advance notification is, for example, a Shutdown Notification defined in the NVMe standard, or a STANDBY IMMEDIATE command defined in the SATA standard.

The controller 5 receives from the host 2 a write command for writing data to the NAND memory 6. The write command specifies a start logical address (start LBA), data size, and data pointer, etc. The start LBA indicates a logical address to which the write data associated with the write command should be written, that is, a first logical block to which the write data should be written. The data size indicates the size of the write data. The data size is expressed, for example, by the number of LBAs. The data pointer is a buffer address that indicates a location on the memory 22 of the host 2 where the write data are stored. The write command may include an identifier that specifies a write destination region. The identifier specifying the write destination region may be, for example, a logical address that specifies a zone as defined in a zoned namespace standard, a namespace identifier that identifies a namespace, or a stream identifier that identifies a stream.

The controller 5 executes a data write operation for the NAND memory 6 in response to receiving a write command specifying the LBA (start LBA) from the host 2. In the data write operation, the controller 5 writes write data received from the host 2 to a write destination block allocated from the plurality of blocks included in the NAND memory 6. That is, the controller 5 selects a block among the plurality of blocks included in the NAND memory 6, then allocates the selected block as the write destination block. The write destination block is a block to which the data are to be written. The write destination block is, for example, a super block. Alternatively, the write destination block may be a physical block. The controller 5 may be simultaneously allocated a plurality of write destination blocks corresponding respectively to a plurality of different regions. In the following, the LBA list save operation will be described focusing on one write destination block.

The controller 5 manages an LBA list corresponding to the write destination block. The LBA list is a list including a plurality of LBAs corresponding respectively to write-uncompleted data that have been received from the host 2 and have not been written to a write destination block. Writing of data to the write destination block is performed from the beginning of the write destination block to the end of the write destination block. Therefore, the write destination block where writing is in progress includes a write-completed region, a write-uncompleted region, and a data-not-received region. The write-completed region is a region where data to be written thereto have been received from the host 2 and has been written thereto. The data stored in the write-completed region are readable data. The write-uncompleted region is a region (a region to which the write-uncompleted data should originally be written) where data to be written thereto have been received from the host 2 and writing of the data to the region has not been completed. If data to be written have been received from the host 2, and there is no data that have been written, all of the regions corresponding to the write destination of the write data specified by the host 2 are regarded as the write-uncompleted region. The data-not-received region is a region where data to be written thereto have not yet been received from the host 2, but if received, will be written thereto. Note that the reception of data from the host 2 is also referred to as acceptance of data from the host 2. Furthermore, when data have not yet been received from the host 2, such a state is referred to as data unreceived (or data unaccepted) and, when data have already been received from the host 2, such a state is referred to as data received (or data accepted).

In a case where power loss has occurred without notice from the host 2, that is, in a case where an unexpected power loss has occurred, data to be lost are the data corresponding to the write-uncompleted region. Therefore, the controller 5 manages a plurality of LBAs, each corresponding to the write-uncompleted data that are data scheduled to be written to the write-uncompleted region, by using the LBA list. Specifically, the LBA list includes a set of LBAs that is a reminder excluding, from a set of LBAs corresponding respectively to data that have been received from the host 2 and are to be written to the write destination block, a set of LBAs corresponding respectively to data that have been written to the write destination block and have become readable from the write destination block. Here, data that have been received from the host 2 and are to be written to the write destination block includes write-completed data that have been received from the host 2 and have been written to the write destination block, and write-uncompleted data that have been received from the host 2 and has not been written to the write destination block.

Furthermore, the controller 5 manages location information that indicates a storage location at the beginning of the write-uncompleted region. The location information is represented by a block address of the write destination block and an offset in the write destination block. The offset indicates an offset from a storage location at the beginning of the write destination block to a storage location at the beginning of the write-uncompleted region.

In a case where an unexpected power loss occurs, the controller 5 uses the power from the capacitor 81 to write the LBA list to the NAND memory 6 instead of the write-uncompleted data. Specifically, the controller 5 writes the LBA list and the location information indicating the storage location at the beginning of the write-uncompleted region to the NAND memory 6, by using the power from the capacitor 81.

By writing the LBA list to the NAND memory 6 in this manner, it is possible to clearly identify the data lost due to the unexpected power loss. The size of the LBA list is sufficiently smaller than the size of the write-uncompleted data. Therefore, the LBA list can be written to the NAND memory 6 within a limited time at which the power of the capacitor 81 can be used.

In addition, by writing the location information indicating the storage location at the beginning of the write-uncompleted region to the NAND memory 6, it is possible to specify the storage location where the writing was interrupted due to the unexpected power loss.

After the power to the memory system 3 is restored, the controller 5 can use the stored LBA list and location information to execute recovery processing. For example, the controller 5 may execute processing of reporting the LBA corresponding to the lost data to the host 2. Furthermore, the controller 5 may execute processing of setting the storage location where the writing was interrupted as an error location.

Next, an example of a configuration of a flash die 61 included in the NAND memory 6 will be described. FIG. 2 is a block diagram illustrating an example of a configuration of the flash die 61 of the NAND memory 6 included in the memory system 3 according to a first embodiment.

Here, the configuration of the flash die 61 will be described focusing on flash die (#0) 61-0. The other flash dies also have the same configuration as the flash die (#0) 61-0. The flash die (#0) 61-0 includes a peripheral circuit 611-0 and a memory cell array 612-0.

The peripheral circuit 611-0 is a circuit that controls the memory cell array 612-0. The peripheral circuit 611-0 includes, for example, a row decoder, a column decoder, a sense amplifier, a latch circuit, and a voltage generation circuit. The peripheral circuit 611-0 executes a program operation, a read operation, or an erase operation for the memory cell array 612-0 in response to receiving an address and a command from the NAND controller 571-0.

The memory cell array 612-0 includes a plurality of planes. A configuration with a plurality of planes is referred to as a multiplane configuration. The memory cell array 612-0 can operate a plurality of planes (here, PLANE #0 and PLANE #1) in parallel.

Each of the planes of the memory cell array 612-0 includes a plurality of blocks (BLK0, BLK1, BLK2, . . . ). Each block BLK is a set of nonvolatile memory cell transistors (hereinafter, simply referred to as memory cell transistors or memory cells). Each block includes a plurality of string units (SU0, SU1, SU2, and SU3). Each string unit SU is a set of memory cell transistors. Each string unit SU includes a plurality of NAND strings NS (also simply referred to as strings). Each NAND string NS is a set of memory cell transistors.

In FIG. 2, a case where four string units SU0, SU1, SU2, and SU3 are included in each block will be described. The number of string units SU included in each block may be three or less, or five or more. Note that a configuration in which each block includes only one string unit SU may also be used. That is, each block includes one or more string units SU.

Next, an example of a configuration of a block will be described. FIG. 3 shows an example of a configuration of a block of the NAND memory 6 included in the memory system 3 according to the embodiment.

In FIG. 3, the configuration of the block will be described focusing on the block BLK0. The other blocks have the same configuration as the block BLK0. The block BLK0 includes four string units (SU0, SU1, SU2, and SU3). The four string units (SU0, SU1, SU2, and SU3) are arranged in a direction (horizontal direction) orthogonal to a direction (vertical direction) in which a plurality of word lines WL0 to WL7 are stacked. Each string unit SU includes a plurality of NAND strings NS. One end of each NAND string NS is connected to a corresponding bit line among a plurality of bit lines (BL0 to BL (L−1)). Each NAND string NS extends vertically. Control gates of a plurality of memory cell transistors included in each NAND string NS are connected to the plurality of word lines (WL0, WL1, . . . , and WL7), respectively.

Next, the relationship between a plurality of channels and a plurality of flash dies 61 will be described. FIG. 4 shows an example of the relationship between a plurality of channels ch.0, ch.1, . . . , and ch.31 and a plurality of flash dies 61 (61-0, 61-1, . . . , and 61-31) used in the memory system 3 according to the embodiment.

In FIG. 4, each of the 32 flash dies 61 has a multiplane configuration including two planes (PLANE #0 and PLANE #1). Each plane includes a plurality of blocks BLK0 to BLKx−1. Each of the blocks BLK0 to BLKx−1 includes a plurality of word lines. Four memory cell groups corresponding to four string units (SU0, SU1, SU2, and SU3) are connected to one word line. Each of the blocks BLK0 to BLKx−1 is a unit of performing data erase operation for erasing data. Each of the blocks BLK0 to BLKx−1 is also referred to as a physical block, a physical memory block, an erase block, or a flash block.

The 32 flash dies 61 can operate in parallel. Furthermore, in each flash die 61, the two planes can operate in parallel.

A plurality of block groups are managed by the controller 5 in order to execute data write operations for a plurality of physical blocks in parallel. A block group is configured by a plurality of physical blocks that can operate in parallel. Hereinafter, the block group is referred to as a super block.

Next, an example of a configuration of the super block will be described. FIG. 5 shows an example of a configuration of the super block in the memory system 3 according to the embodiment and an example of a relationship between each of a plurality of storage locations included in the super block and each of a plurality of offsets corresponding to the storage locations in the super block.

Here, it is assumed that the block BLK0 of the plane #0 (PLANE #0) and the block BLK0 of the plane #1 (PLANE #1) included in any flash die 61 construct a super block SB0.

Each block includes four string units (SU0, SU1, SU2, and SU3). Each string unit is connected to a plurality of word lines (WL0, WL1, . . . ).

In the case of writing data to the super block SB0 in a quad-level cell (QLC) mode, which stores 4-bit data per memory cell, data corresponding to four pages (lower, middle, upper, and higher) are written in a memory cell group connected to one word line and contained in one string unit. The size of one page is, for example, 16 KB. One page contains multiple sectors. For example, in a case where the size of one sector is 4 KB, one page contains four sectors.

Therefore, the memory cell group connected to one word line and contained in one string unit includes 16 storage locations corresponding to 16 sectors.

In the following, a memory cell group (hereinafter referred to as MG) connected to a word line WLn and included in a string unit SUm is referred to as MG (WLn, SUm).

A physical address indicating a storage location x of the super block SB0 is represented by the block address of the super block SB0 and the offset from the storage location at the beginning of the super block SB0 to the storage location x. The offset is represented by a multiple of the sector.

The offset of each storage location is set based on the order in which data are written to each sector.

First, the controller 5 performs writing four pages (lower, middle, upper, and higher) of data to MG (WL0, SU0) of the block BLK0 of the plane #0 and writing four pages (lower, middle, upper, and higher) of data to MG (WL0, SU0) of the block BLK0 of the plane #1. MG (WL0, SU0) of the block BLK0 of the plane #0 and MG (WL0, SU0) of the block BLK0 of the plane #1 include a total of 32 storage locations (=4 sectors×QLC (4 pages)×2 planes). Therefore, a total of 32 offsets (+0 to +31) are set in MG (WL0, SU0) of the block BLK0 of the plane #0 and MG (WL0, SU0) of the block BLK0 of the plane #1. For example, in MG (WL0, SU0) of the block BLK0 of the plane #0, an offset (+0 to +3) can be set in the four sectors of the lower page, an offset (+4 to +7) can be set in the four sectors of the middle page, an offset (+8 to +11) can be set in the four sectors of the upper page, and the offset (+12 to +15) can be set in the four sectors of the higher page. Furthermore, in MG (WL0, SU0) of the block BLK0 of the plane #1, an offset (+16 to +19) can be set in the four sectors of the lower page, an offset (+20 to +23) can be set in the four sectors of the middle page, an offset (+24 to +27) can be set in the four sectors of the upper page, and an offset (+28 to +31) can be set in the four sectors of the higher page.

Next, the controller 5 performs writing four pages of data to MG (WL0, SU1) of the block BLK0 of the plane #0 and writing four pages of data to MG (WL0, SU1) of the block BLK0 of the plane #1. Therefore, a total of 32 offsets (+32 to +63) are set in MG (WL0, SU1) of the block BLK0 of the plane #0 and MG (WL0, SU1) of the block BLK0 of the plane #1. For example, in MG (WL0, SU1) of the block BLK0 of the plane #0, an offset (+32 to +35) can be set in the four sectors of the lower page, an offset (+36 to +39) can be set in the four sectors of the middle page, an offset (+40 to +43) can be set in the four sectors of the upper page, and an offset (+44 to +47) can be set in the four sectors of the higher page. Furthermore, in MG (WL0, SU1) of the block BLK0 of the plane #1, an offset (+48 to +51) can be set in the four sectors of the lower page, an offset (+52 to +55) can be set in the four sectors of the middle page, an offset (+56 to +59) can be set in the four sectors of the upper page, and an offset (+60 to +69) can be set in the four sectors of the higher page.

Next, the controller 5 performs writing four pages of data to MG (WL0, SU2) of the block BLK0 of the plane #0 and writing four pages of data to MG (WL0, SU2) of the block BLK0 of the plane #1. Therefore, a total of 32 offsets (+64 to +95) are set in MG (WL0, SU2) of the block BLK0 of the plane #0 and MG (WL0, SU2) of the block BLK0 of the plane #1. For example, in MG (WL0, SU2) of the block BLK0 of the plane #0, an offset (+64 to +67) can be set in the four sectors of the lower page, an offset (+68 to +71) can be set in the four sectors of the middle page, an offset (+72 to +75) can be set in the four sectors of the upper page, and an offset (+76 to +79) can be set in the four sectors of the higher page. Furthermore, in MG (WL0, SU2) of the block BLK0 of the plane #1, an offset (+80 to +83) can be set in the four sectors of the lower page, an offset (+84 to +87) can be set in the four sectors of the middle page, an offset (+88 to +91) can be set in the four sectors of the upper page, and an offset (+92 to +95) can be set in the four sectors of the higher page.

Next, the controller 5 performs writing four pages of data to MG (WL0, SU3) of the block BLK0 of the plane #0 and writing four pages of data to MG (WL0, SU3) of the block BLK0 of the plane #1. Therefore, a total of 32 offsets (+96 to +127) are set in MG (WL0, SU3) of the block BLK0 of the plane #0 and MG (WL0, SU3) of the block BLK0 of the plane #1. For example, in MG (WL0, SU3) of the block BLK0 of the plane #0, an offset (+96 to +99) can be set in the four sectors of the lower page, an offset (+100 to +71) can be set in the four sectors of the middle page, an offset (+72 to +103) can be set in the four sectors of the upper page, and an offset (+104 to +107) can be set in the four sectors of the higher page. Furthermore, in MG (WL0, SU3) of the block BLK0 of the plane #1, an offset (+112 to +115) can be set in the four sectors of the lower page, an offset (+116 to +119) can be set in the four sectors of the middle page, an offset (+120 to +123) can be set in the four sectors of the upper page, and an offset (+124 to +127) can be set in the four sectors of the higher page.

Next, the controller 5 performs writing four pages of data to MG (WL1, SU0) of the block BLK0 of the plane #0 and writing four pages of data to MG (WL1, SU0) of the block BLK0 of the plane #1. Therefore, a total of 32 offsets (+128 to +159) are set in MG (WL1, SU0) of the block BLK0 of the plane #0 and MG (WL1, SU0) of the block BLK0 of the plane #1.

Next, a multi-step program operation will be described. In a case of writing data in the QLC mode, the controller 5 executes a data write operation for each of the plurality of memory cell groups included in the write destination block using the multi-step program operation that includes at least a first-step program operation and a second-step program operation. In the first-step program operation, four pages of data to be written are transferred to the NAND memory 6, and the four pages of data are written to the memory cell group MG (WLn, SUm) of the write destination block. In the first-step program operation, a threshold voltage of each memory cell is roughly set. In this state, data cannot be read normally from each memory cell. In the second-step program operation, the same four pages of data as the data transferred in the first-step program operation are transferred to the NAND memory 6 again, and the four pages of data are written to the memory cell group MG (WLn, SUm) in which the first-step program operation was executed. In the second-step program operation, a threshold voltage of each memory cell is set to a target threshold voltage corresponding to the data to be written. When the second-step program operation is completed, data can be correctly read from the memory cell group MG (WLn, SUm).

The second-step program operation for the memory cell group MG (WLn, SUm) is executed after the first-step program operation for another memory cell group MG (WL(n+1), SUm) is executed. The memory cell group MG (WL(n+1), SUm) is a memory cell group MG which belongs to the same string unit SUm as the memory cell group MG (WLn, SUm) and is connected to a word line WL (n+1) subsequent to the word line WLn to which the memory cell group MG (WLn, SUm) is connected.

As the multi-step program operation, for example, a foggy-fine program operation may be used. The foggy-fine program operation includes a foggy program operation and a fine program operation. The foggy program operation is a program operation (first-step program operation) to set a threshold voltage of each memory cell roughly. The fine program operation is a program operation (second-step program operation) to set the threshold voltage of each memory cell to a target threshold voltage by adjusting the threshold voltage of each memory cell.

The foggy-fine program operation for a write destination block is executed in the following manner. In the following, a case is assumed in which the super block SB0 shown in FIG. 5 is allocated as the write destination block by the controller 5.

(1) First, the foggy program operation for MG (WL0, SU0) of the block BLK0 of the plane #0 and the foggy program operation for MG (WL0, SU0) of the block BLK0 of the plane #1 are executed. Here, write data having a size of eight pages are transferred to the NAND memory 6. The page size of one page corresponds to the number of strings included in one string unit SU, that is, the number of memory cells included in one memory cell group MG.

(2) Next, the foggy program operation for MG (WL0, SU1) of the block BLK0 of the plane #0 and the foggy program operation for MG (WL0, SU1) of the block BLK0 of the plane #1 are executed.

(3) Next, the foggy program operation for MG (WL0, SU2) of the block BLK0 of the plane #0 and the foggy program operation for MG (WL0, SU2) of the block BLK0 of the plane #1 are executed.

(4) Next, the foggy program operation for MG (WL0, SU3) of the block BLK0 of the plane #0 and the foggy program operation for MG (WL0, SU3) of the block BLK0 of the plane #1 are executed.

(5) When the foggy program operation for MG (WL0, SU0) to MG (WL0, SU3) of the block BLK0 of the plane #0 and the foggy program operation for MG (WL0, SU0) to MG (WL0, SU3) of the block BLK0 of the plane #1 are completed, the foggy program operation for MG (WL1, SU0) of the block BLK0 of the plane #0 and the foggy program operation for MG (WL1, SU0) of the block BLK0 of the plane #0 are executed.

(6) When the foggy program operation for MG (WL1, SU0) of the block BLK0 of the plane #0 and the foggy program operation for MG (WL1, SU0) of the block BLK0 of the plane #0 are completed, the fine program operation for MG (WL0, SU0) of the block BLK0 of the plane #0 and the fine program operation for MG (WL0, SU0) of the block BLK0 of the plane #1 are executed. Here, the same write data as the write data used in the foggy program operations for MG (WL0, SU0) of the block BLK0 of the plane #0 and MG (WL0, SU0) of the block BLK0 of the plane #1 are transferred again to the NAND memory 6. Then, the fine program operation for MG (WL0, SU0) of the block BLK0 of the plane #0 and the fine program operation for MG (WL0, SU0) of the block BLK0 of the plane #1 are executed. When this fine program operation is completed, writing for MG (WL0, SU0) of the block BLK0 of the plane #0 and writing for MG (WL0, SU0) of the block BLK0 of the plane #1 are completed. That is, the data written into MG (WL0, SU0) of the block BLK0 of the plane #0 and the data written into MG (WL0, SU0) of the block BLK0 of the plane #1 become readable data that can be read normally from the NAND memory 6.

(7) Next, the foggy program operation for MG (WL1, SU1) of the block BLK0 of the plane #0 and the foggy program operation for MG (WL1, SU1) of the block BLK0 of the plane #1 are executed.

(8) When the foggy program operation for MG (WL1, SU1) of the block BLK0 of the plane #0 and the foggy program operation for MG (WL1, SU1) of the block BLK0 of the plane #1 are completed, the fine program operation for MG (WL0, SU1) of the block BLK0 of the plane #0 and the fine program operation for MG (WL0, SU1) of the block BLK0 of the plane #1 are executed. When this fine program operation is completed, writing for MG (WL0, SU1) of the block BLK0 of the plane #0 and writing for MG (WL0, SU1) of the block BLK0 of the plane #1 are completed. That is, the data written into MG (WL0, SU1) of the block BLK0 of the plane #0 and the data written into MG (WL0, SU1) of the block BLK0 of the plane #1 become readable data that can be read normally from the NAND memory 6.

Next, a write operation and a power loss protection (PLP) operation for the write destination block will be described. FIG. 6 illustrates an example of the write operation and the PLP operation for the write destination block executed in the memory system 3.

The controller 5 may execute two types of PLP operations. One of the two types of PLP operations is a PLP operation (first PLP operation) that backs up the LBA list in the event of an unexpected power loss. The other of the two types of PLP operations is a PLP operation (second PLP operation) that completes writing of the write-uncompleted data to the NAND memory 6 in the event of an unexpected power loss.

The controller 5 manages a set of first blocks and a set of second blocks, writing to the set of first blocks, in a case where the unexpected power loss occurs, being controlled in a first mode that backs up a list of LBAs corresponding respectively to the write-uncompleted data which have been received from the host 2 and have not been written to the NAND memory 6, and writing to the set of second blocks, in a case where the unexpected power loss occurs, being controlled in a second mode that completes writing of the write-uncompleted data to the NAND memory 6.

In the following, blocks belonging to the second set of blocks are referred to as blocks of a PLP target, and blocks belonging to the first set of blocks are referred to as blocks that are not the PLP target.

FIG. 6 illustrates an example of a case in which the controller 5 allocates 20 super blocks of super blocks SB0 to SB19 and one single level cell (SLC) block as write destination blocks. The SLC block is a block in which data are written in an SLC mode that stores one bit of data per memory cell. The super blocks SB0 to SB14 are blocks of the PLP target. The super blocks SB15 to SB19 are blocks that are not the PLP target.

First, a case where data are written to the PLP target block, for example, the super block SB0 will be described.

(1) Each time a write command is received from the host 2, the controller 5 stores data received from the host 2 in the internal buffer 531. The controller 5 waits until data for the write size are stored in internal buffer 531. In a case where the page size is four sectors (=16 KB), the write size is 32 sectors (=4 sectors×2 planes×4 (QLC)) in a case where data are written in the super block SB0 in the QLC mode. The controller 5 waits until the data for 32 sectors to be written in the super block SB0 are accumulated in the internal buffer 531.

(2-a) When the data for 32 sectors to be written in the super block SB0 are accumulated in internal buffer 531, the controller 5 executes the foggy program operation to write 32 sectors of data to the super block SB0. For example, four pages (=16 sectors) of data are written to MG (WL0, SU0) of the block of the plane #0 of the super block SB0. Furthermore, four pages (=16 sectors) of data are written to MG (WL0, SU0) of the block of the plane #1 of the super block SB0. The fine program operation for MG (WL0, SU0) of the block of the plane #0 becomes executable after the foggy program operation for MG (WL0, SU1) to MG (WL0, SU3) and MG (WL1, SU0) of the block of the plane #0 is executed. Similarly, the fine program operation for MG (WL0, SU0) of the block of the plane #1 also becomes executable after the foggy program operation for MG (WL1, SU0) to MG (WL0, SU3) and MG (WL1, SU0) of the block of the plane #1 is executed. Therefore, as the writing to the super block SB0 progresses, the data for a total of 160 sectors (=4 sectors×2 planes×4 (QLC)×5 string units) are maintained in the internal buffer 531. The data for the 160 sectors are data being written to the super block SB0, that is, data for which the write operation to the super block SB0 is is progress.

(3-a) In a case where an unexpected power loss occurs at a timing during the progress of writing, the controller 5 uses the power from capacitor 81 to write the write-uncompleted data that have not been written to the super block SB0 to the NAND memory 6. The write-uncompleted data may be written to super block SB0 or to the single level cell (SLC) block of the NAND memory 6. The SLC block is a block to which the data are written in the SLC mode which stores one bit of data per memory cell.

Next, a case where data are written to a block that is not the PLP target, for example, the super block SB15, will be described. One LBA list is allocated to the super block SB15.

(1) Each time a write command is received from the host 2, the controller 5 stores the data received from the host 2 in the internal buffer 531.

(2-b) Each time data to be written to the superblock SB15 are stored in the internal buffer 531, the controller 5 adds a set of LBAs corresponding to the data stored in the internal buffer 531, to the LBA list corresponding to the superblock SB15. Furthermore, the controller 5 manages the location information (super block address SBA, offset) indicating the storage location at the beginning of the write-uncompleted region of the super block SB15 in association with the LBA list. The controller 5 waits until the data for 32 sectors to be written to the super block SB15 are accumulated in the internal buffer 531.

(3-b) When the data for 32 sectors to be written to the super block SB15 are accumulated in the internal buffer 531, the controller 5 executes the foggy program operation for writing the data for 32 sectors to the super block SB15. For example, four pages (=16 sectors) of data are written in MG (WL0, SU0) of the block of the plane #0 of the super block SB15. Furthermore, four pages (=16 sectors) of data are written in MG (WL0, SU0) of the block of plane #1 of the super block SB15. The fine program operation for MG (WL0, SU0) of the block of the plane #0 becomes executable after the foggy program operation for MG (WL0, SU1) to MG (WL0, SU3) and MG (WL1, SU0) of the block of the plane #0 is executed. Similarly, the fine program operation for MG (WL0, SU0) of the block of the plane #1 also becomes executable after the foggy program operation for MG (WL1, SU0) to MG (WL0, SU3) and MG (WL1, SU0) of the block of the plane #1 is executed. Therefore, as the writing to the super block SB15 progresses, the data for a total of 160 sectors (=4 sectors×2 planes×4 (QLC)×5 string units) are maintained in the buffer 531. The data for the 160 sectors are data being written to the super block SB15, that is, the data for which the write operation to the super block SB15 is in progress. The 160 LBAs corresponding respectively to the 160 sectors are a set of LBAs corresponding respectively to the data being written to the super block SB15. These 160 LBAs are maintained in the LBA list corresponding to the superblock SB15. Furthermore, in the LBA list corresponding to the super block SB15, the LBAs corresponding respectively to the data that have been received from the host 2 and has not yet started to be written to the super block SB15 are also maintained. In the case where the write size of the super block SB15 is 32 sectors, the maximum size of the received and unwritten data is 32 sectors. Therefore, the maximum number of LBAs included in the LBA list corresponding to the super block SB15 is 192 (=4 sectors×2 planes×4 (QLC)×(5 string units+1)).

(4-b) In a case where an unexpected power loss occurs at a timing during which writing is in progress, the controller 5 uses the power from the capacitor 81 to write the set of LBAs included in the LBA list corresponding to the super block SB15 and the location information (super block address SBA, offset) indicating the storage location at the beginning of the write-uncompleted region of the super block SB15 to the NAND memory 6. The set of LBAs and the location information may be written in the SLC block of the NAND memory 6.

Figure 7:
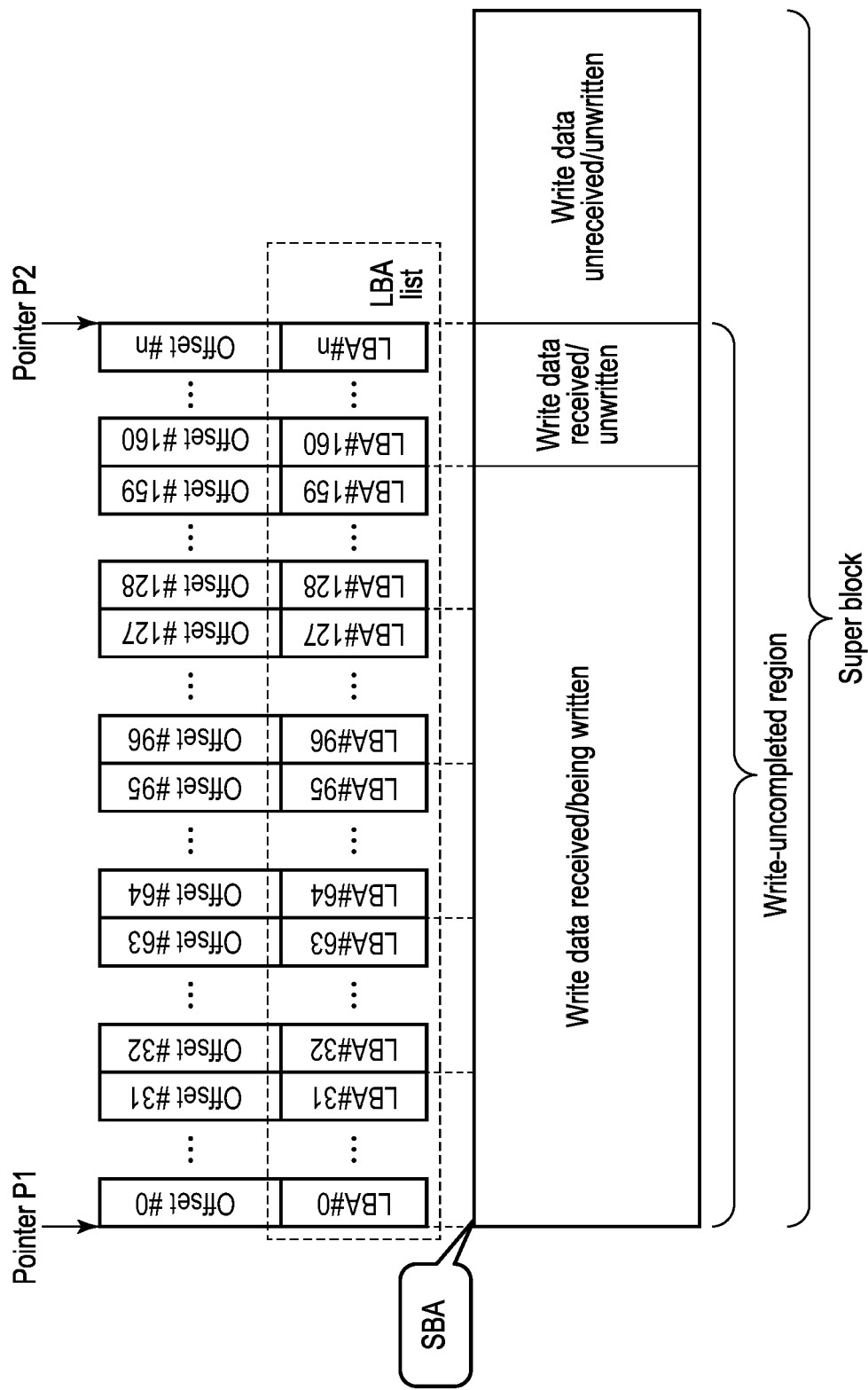
FIG. 7 is a diagram illustrating an example of a relationship between the write destination block and a logical address list (LBA list) managed in the memory system according to the embodiment.

Next, the relationship between the write destination block and the logical address list (LBA list) will be described. FIG. 7 illustrates an example of the relationship between the write destination block and the logical address list (LBA list) managed in the memory system 3 according to the embodiment.

When a super block that is not the PLP target is allocated as the write destination block, one LBA list is allocated to the super block.

The LBA list is used to store a plurality of LBAs corresponding respectively to the write-uncompleted data that have been received from the host 2 and has not been written to the super block.

The super block includes a "write-uncompleted" region and a "write data unreceived/unwritten" region. The "write-uncompleted" region is a region in which write-uncompleted data that have been received from the host 2 and has not been written to the super block are to be written.

The "write-uncompleted" region includes a "write data received/being written" region and a "write data received/unwritten region".

The "write data received/being written" region is a region in which the write operation is being executed. In a case where the page size is four sectors, the size of the "write data received/being written" region is 160 sectors (=4 sectors×2 planes×4 (QLC)×5 string units) in the case of writing data to the super block in the QLC mode using the foggy-fine program operation.

The "write data received/unwritten region" is a region in which write data have been received from the host 2 but writing has not started. In a case where the page size is four sectors, the maximum size of "written data received/unwritten region" is 32 sectors (=4 sectors×2 planes×4 (QLC)) in the case of writing data to the super block in the QLC mode using the foggy-fine program operation.

Therefore, the size of the "write-uncompleted" region is 192 sectors (=4 sectors×2 planes×4 (QLC)×(5 string units+1)).

Furthermore, in the case of writing the data to the super block in the TLC mode using the full sequence program operation, the writing of three pages of data is completed by writing the three pages of data to the memory cell group. Therefore, the size of the "write data received/being written" region is 24 sectors (=4 sectors×2 planes×3 (TLC)×1 string unit). Furthermore, the maximum size of the "write data received/unwritten region" is 24 sectors (=4 sectors×2 planes×3 (TLC)).

Therefore, the size of the "write-uncompleted" region is 48 sectors (=4 sectors×2 planes×4 (QLC)×(1 string unit+1)).

In the following, a case of writing data to the super block in the QLC mode by using the foggy-fine program operation is assumed.

The 160 LBAs (LBA #0 to #31, LBA #32 to #63, LBA #64 to #95, LBA #96 to #127, LBA #128 to #159) included in the LBA list are LBAs corresponding respectively to the write-uncompleted data that have been received from the host 2 and have not been written to the super block.

For example, the first 32 LBAs #0 to #31 are LBAs corresponding to the data to be written to 32 storage locations of the superblock corresponding to offsets #0 to #31. The offsets #0 to #31 are storage locations indicated by the offsets +0 to +31 described in FIG. 5.

The next 32 LBAs #32 to #63 after the LBAs #0 to #31 are LBAs corresponding respectively to the data to be written to 32 storage locations of the super block corresponding to offsets #32 to #63. The offsets #32 to #63 are storage locations indicated by the offsets +32 to +63 described in FIG. 5.

The next 32 LBAs #64 to #95 after the LBAs #32 to #63 are LBAs corresponding respectively to the data to be written to 32 storage locations of the super block corresponding to offsets #64 to #95. The offsets #64 to #95 are storage locations indicated by the offsets +64 to +95 described in FIG. 5.

The next 32 LBAs #96 to #127 after the LBAs #64 to #95 are LBAs corresponding respectively to the data to be written in 32 storage locations of the superblock corresponding to offsets #96 to #127. The offsets #96 to #127 are storage locations indicated by the offsets +96 to +127 described in FIG. 5.

The next 32 LBAs #128 to #159 after the LBAs #96 to #127 are LBAs corresponding respectively to the data to be written in 32 storage locations of the superblock corresponding to offsets #128 to #159. The offsets #128 to #159 are storage locations indicated by the offsets +128 to +159 described in FIG. 5.

When the data to be written in the "write data received/ unwritten region" are stored in the internal buffer 531, LBAs (for example, LBAs #160 to #n) corresponding respectively to the stored data are added to the LBA list. At this time, offsets #160 to #n may also be added to the LBA list together with the LBAs #160 to #n.

As described above, in the LBA list, the LBAs (LBAs #0 to #159, #160 to #n) corresponding respectively to the write-uncompleted data are arranged in the same order as the order in which the write-uncompleted data are written in the write-uncompleted region, that is, in the same order as the order of the offsets #0 to #159 and #160 to #n. Furthermore, in the LBA list, not only the LBAs #0 to #159 and #160 to #n but also the offsets #0 to #159 and #160 to #n may be retained.

The LBA list is managed by two pointers P1 and P2. The pointer P1 is a pointer indicating a location of the next LBA to be deleted or extracted from the LBA list. The pointer P2 is a pointer indicating a location for storing a new LBA.

Furthermore, in FIG. 7, the location information indicating the storage location at the beginning of the write-uncompleted region is represented by the super block address SBA and the offset #0.

FIG. 8 illustrates another example of the relationship between the write destination block and the logical address list (LBA list) managed in the memory system 3 according to the embodiment.

FIG. 8 illustrates an example in which the writing of data for 32 sectors corresponding to the LBA #0 to #31 is completed, and the data for 32 sectors have become readable.

The 32 storage locations at the beginning of the super block become a "write completed/readable" region. A "write completed/readable" region is a region in which data that has been written and has become readable from the super block is stored. When the data for 32 sectors becomes readable, the 32 LBAs #0 to #31 corresponding to the readable data are deleted from the LBA list. As a result, free space for storing new 32 LBAs is allocated in the LBA list. Furthermore, the location information indicating the storage location at the beginning of the write-uncompleted region is advanced by the write size (32 sectors).

In FIG. 8, 160 LBAs #32 to #191 are stored in the LBA list as LBAs corresponding respectively to the data being written in the "write data received/being written" region.

When the data to be written in the "write data received/ unwritten region" are stored in the internal buffer 531, the LBAs (for example, LBAs #192 to #m) corresponding respectively to the stored data are added to the LBA list.

In a case where an unexpected power loss has occurred in a state where the LBA list stores the LBAs #32 to #191 and the LBAs #192 to #m, the LBAs #32 to #191 and the LBAs #192 to #m and the location information (super block address SBA, offset #32) indicating the storage location at the beginning of the write-uncompleted region are written in the NAND memory 6.

When the writing of data to the entire super block is completed, the entire super block becomes the "write-completed/readable" region. In this case, the LBA list becomes empty. Then, the controller 5 deallocate the LBA list from this super block. The deallocated LBA list is allocated to a super block that is newly allocated as the write destination block.

Figure 9:
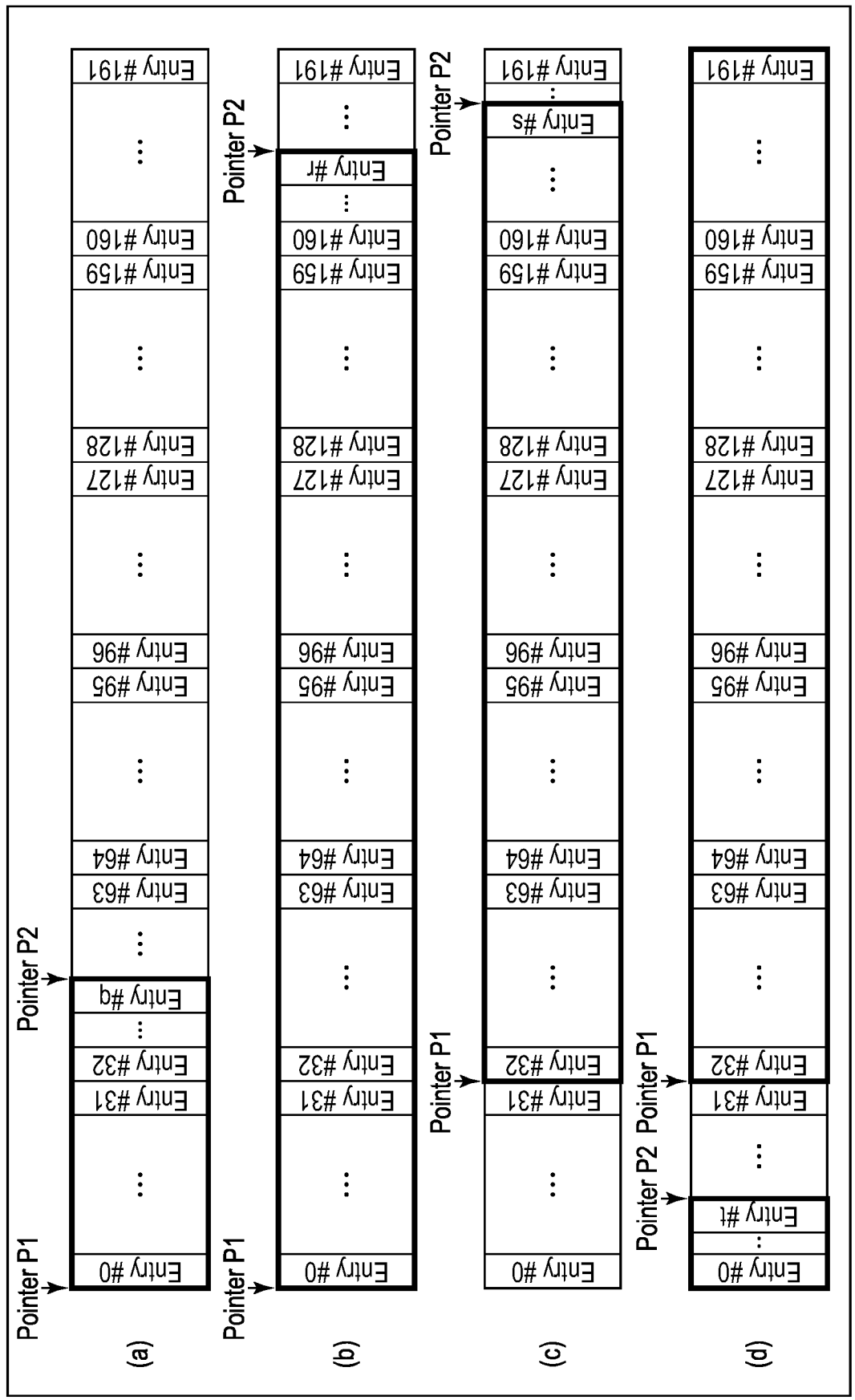
FIG. 9 is a diagram illustrating an example of a configuration of a ring buffer used to hold the LBA list in the memory system according to the embodiment.

Next, the configuration of a ring buffer will be described. FIG. 9 illustrates an example of a configuration of the ring buffer used to hold the LBA list.

The ring buffer contains a plurality of entries, such as 192 entries. Each of the plurality of entries in the ring buffer is a region that stores one LBA. The pointer P1 is a pointer that indicates an entry that stores the next LBA to be deleted or extracted from the ring buffer. The pointer P1 is also referred to as a head pointer. The pointer P2 is a pointer that indicates the next entry for storing a new LBA. The pointer P2 is also referred to as a tail pointer.

In FIG. 9 (a), LBAs are respectively stored in the entries #0 to #q indicated by the pointer P1 and the pointer P2.

When data to be written to the super block are newly received from the host 2, LBAs respectively corresponding to the received data are added to the ring buffer. As shown in FIG. 9 (b), the value of the pointer P2 is incremented by the number of added LBAs. In FIG. 9 (b), LBAs are stored respectively in entries #0 to #r indicated by the pointer P1 and the incremented pointer P2.

When the fine program operation of the data corresponding to the 32 LBAs corresponding to the entries #0 to #31 is completed, the value of the pointer P1 is incremented and updated to 32 as shown in FIG. 9 (c). As a result, since the entries #0 to #31 are released, 32 LBAs are deleted from the ring buffer. In FIG. 9 (c), the LBAs are respectively stored in the entries #32 to #s indicated by the incremented pointer P1 and the pointer P2. At this time, the pointer P2 is also updated.

When the value obtained by adding one to the value of the pointer P2 becomes 192, the value of the pointer P2 is reset to zero. This allows the LBA to be added to each free entry at the beginning of the ring buffer. FIG. 9 (d) shows a case where the LBA is added to each of the free entries at the beginning of the ring buffer. In FIG. 9 (d), the pointer P1 indicates the entry #32, and the pointer P2 indicates the entry #t (<32). In this manner, in FIG. 9 (d), the LBAs are stored in the entries #32 to #191 and the entries #0 to #t, respectively.

Next, a procedure of the data write operation will be described. FIG. 10 is a flowchart illustrating a procedure of the data write operation executed in the memory system 3 according to the embodiment.

The controller 5 determines whether or not a write command is received from the host 2 (S101).

In the case where the write command is not received (No in S101), the controller 5 waits until the write command is received.

In the case where the write command is received (Yes in S102), the controller 5 receives write data from the host 2 (S102). The controller 5 stores the received write data in the internal buffer 531.

The controller 5 determines whether or not a write destination block to which the received write data is to be written is a PLP target (S103).

In the case where the write destination block is the PLP target (Yes in S103), the controller 5 determines whether or not the size of the received write data has reached the write size (S104). For example, the write size is the data size of 32 sectors.

In the case where the size of the write data has not reached the write size (No in S104), the controller 5 waits until a subsequent write command is received (returns to S101).

In the case where the size of the write data has reached the write size (Yes in S104), the controller 5 executes a write operation to write the write data of the write size to the NAND memory 6 (S105).

Then, the controller 5 ends the data write operation (End).

In the case where the write destination block is not the PLP target (No in S103), the controller 5 adds the LBA specified by the received write command and the offset corresponding to the storage location where the write data are to be written, to the LBA list (S106). In this case, the controller 5 selects the LBA list corresponding to the write destination block. The controller 5 then adds the LBA and the offset to the selected LBA list. Furthermore, based on the addition of the LBA, the controller 5 increments the pointer P2 of the LBA list.

The controller 5 determines whether or not the size of the write data has reached the write size (S107).

In the case where the size of the write data has not reached the write size (No in S107), the controller 5 waits until a subsequent write command is received (returns to S101).

In the case where the size of the write data has reached the write size (Yes in S107), the controller 5 executes a write operation to write the write data of the write size to the NAND memory 6 (S108).

The controller 5 determines whether or not there are data that have become readable by the write operation executed in S108 (S109). In this case, the controller 5 determines whether or not a fine write operation was executed by the write operation in S108.

In the case where there are no data that have become readable (No in S109), the controller 5 ends the data write operation (End).

In the case where there are readable data (Yes in S109), the controller 5 deletes the LBAs corresponding to the readable data from the LBA list and updates the storage location information corresponding to the LBA list (S110). The controller 5 increments the pointer P1 of the LBA list corresponding to the write destination block.

The controller 5 then ends the data write operation (End).

Figure 11:
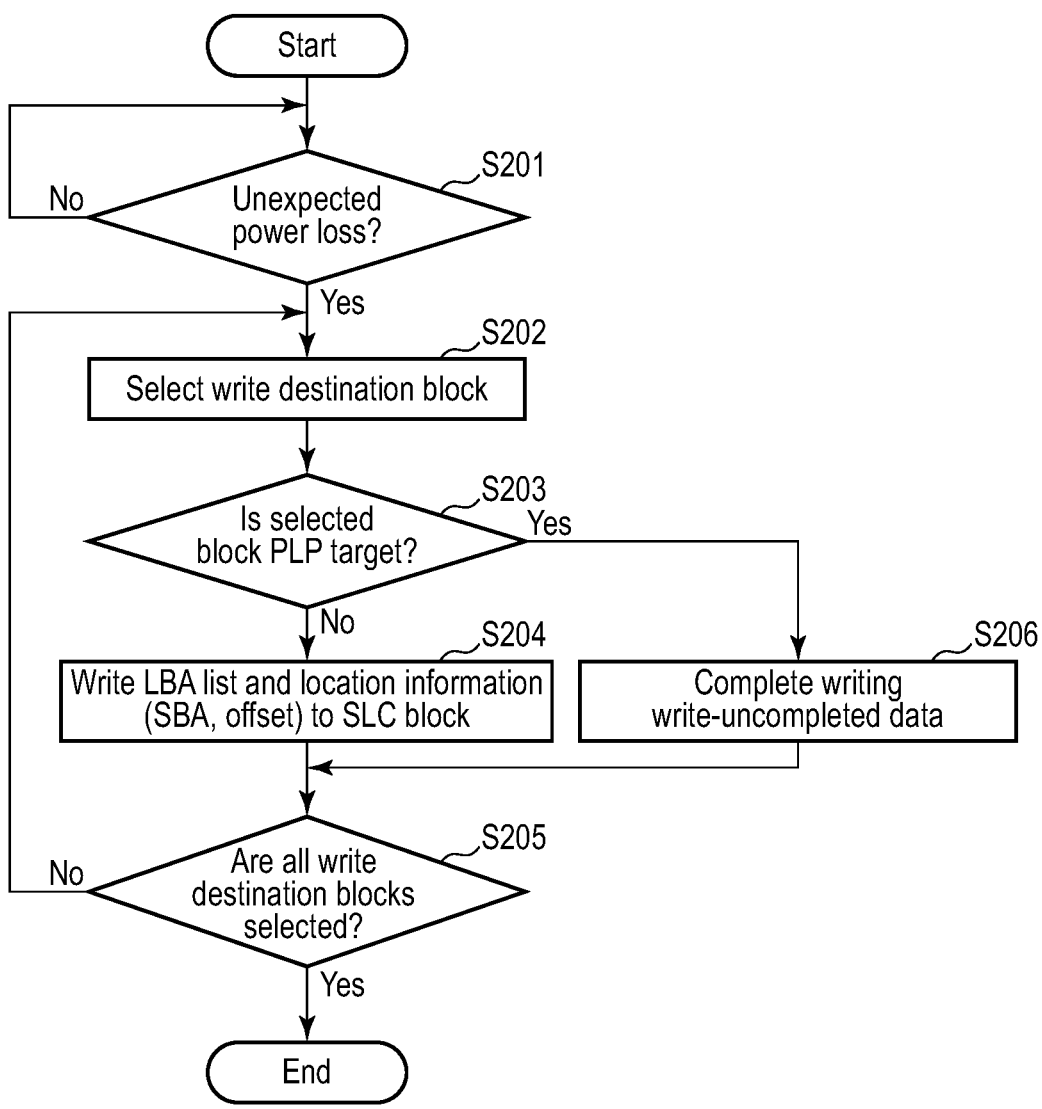
FIG. 11 is a flowchart illustrating a procedure of the PLP operation executed in the memory system according to the embodiment.

Next, a procedure of the PLP operation will be described. FIG. 11 is a flowchart illustrating a procedure of the PLP operation executed in the memory system 3 according to the present embodiment.

The controller 5 determines whether or not an unexpected power loss has occurred (S201). The controller 5 determines whether or not the supply of the power to the memory system 3 has been shut off without notification from the host 2.

In the case where the unexpected power loss has not occurred (No in S201), the controller 5 waits.

In the case where the unexpected power loss has occurred (Yes in S201), the controller 5 selects any block from the write destination blocks (S202).

The controller 5 determines whether or not the selected block is the PLP target (S203).

In the case where the selected block is not the PLP target (No in S203), the controller 5 writes the LBA list and the location information (super block address SBA, offset) to the SLC block (S204). The controller 5 writes the information stored in the LBA list corresponding to the selected block and the location information to the SLC block, thereby making them nonvolatile.

The controller 5 determines whether or not all write destination blocks have been selected (S205).

In the case where there is a write destination block that has not yet been selected (No in S205), the controller 5 selects any block from the write destination blocks that have not been selected (S202).

In the case where the selected block is the PLP target (Yes in S203), the controller 5 completes the writing of the write-uncompleted data corresponding to the selected block (S206). For example, the controller 5 writes the write-uncompleted data and dummy data to the selected block to make the selected block a closed state in which the entire selected block is written with data. The controller 5 may also write the write-uncompleted data to the SLC block.

The controller 5 then determines whether or not all write destination blocks have been selected (S205).

In the case where all write destination blocks have been selected (Yes in S205), the controller 5 ends the PLP operation (End).

Next, a procedure of an LBA notification operation will be described. FIG. 12 is a flowchart illustrating the procedure of the LBA notification operation executed in the memory system 3 according to the embodiment.

When the power to the memory system 3 is restored (Yes in S301), the controller 5 determines whether or not information of the LBA list (a plurality of LBAs corresponding to the lost write data) exists in the SLC block (S302).

In the case where the information of the LBA list exists in the SLC block (Yes in S302), the controller 5 updates the L2P table 71 (S303). The controller 5 stores a value indicating an error in the entry of the L2P table 71 corresponding to each of the plurality of LBAs included in the information of the LBA list. The value indicating the error may be, for example, a magic number indicating an invalid physical address (PBA).

The controller 5 notifies the host 2 of the information of the LBA list (S304). In response to a command received from host 2 to acquire the log of the memory system 3, the controller 5 provides the information of the LBA list to the host 2. The controller 5 may also execute the procedure of notifying the host 2 of the information of the LBA list before executing the procedure of S303.

The controller 5 then ends the LBA notification operation (End).

In the case where the information of the LBA list does not exist in the SLC block (No in S302), the controller 5 ends the LBA notification operation (End).

Next, a procedure of a data read operation will be described. FIG. 13 is a flowchart illustrating the procedure of the data read operation executed in the memory system 3 according to the embodiment.

The controller 5 determines whether or not a read command has been received from the host 2 (S401).

In the case where the read command has not been received (No in S401), the controller 5 waits until the read command is received.

In the case where the read command is received (Yes in S401), the controller 5 determines whether or not a read target LBA corresponds to the invalid PBA (S402). In this case, the controller 5 acquires a PBA corresponding to the LBA specified by the read command by referring to the L2P table 71. The controller 5 determines whether or not the acquired PBA has an invalid value.

In the case where the read target LBA corresponds to the invalid PBA (Yes in S402), the controller 5 notifies the host 2 of an error (S403). The controller 5 transmits a notification indicating the error to the host 2 as a response to the received read command.

The controller 5 then ends the read operation (End).

In the case where the read target LBA does not correspond to the invalid PBA (No in S402), the controller 5 executes the read operation (S404). The controller 5 reads data stored in the storage location indicated by the PBA corresponding to the read target LBA.

The controller 5 transmits the read data to the host 2 (S405).

The controller 5 then ends the read operation (End).

As described above, according to the present embodiment, the controller 5 writes to the NAND memory 6 the LBA list including the set of LBAs corresponding respectively to the write-uncompleted data and the location information indicating the storage location at the beginning of the write-uncompleted region, by using the power from the capacitor 81. By writing the LBA list to the NAND memory 6 in this manner, it is possible to clearly identify the data lost due to the unexpected power loss.

Therefore, even if write-uncompleted data are lost due to an unexpected power loss, the controller 5 can provide information of the LBAs corresponding to the lost data to the host 2.

In addition, by writing the location information indicating the storage location at the beginning of the write-uncompleted region to NAND memory 6, it is possible to identify the storage location where the writing was interrupted due to the unexpected power loss.

In addition, by mapping an invalid PBA (magic number) to the LBA corresponding to the lost data, the controller 5 can notify the error even in the case of receiving a read command that specifies this LBA. This can prevent the controller 5 from reading the wrong data and transmitting it to the host 2.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A memory system connectable to a host, comprising:
a nonvolatile memory including a plurality of blocks; and
a controller configured to write, in response to receiving from the host a write command specifying a logical address, data received from the host to a first write destination block allocated from the plurality of blocks, wherein
the controller is configured to:
manage a first list and a first storage location information, the first list including a plurality of logical addresses corresponding respectively to write-uncompleted data that have been received from the host and have not been written to the first write destination block, and the first storage location information indicating a storage location at a beginning of a write-uncompleted region in the first write destination block for which writing of data have not been completed; and
in a case where a power loss has occurred in which supply of power to the memory system is shut off without notice from the host, write the first list and the first storage location information to the nonvolatile memory using power from a capacitor that stores power to be supplied to the memory system.

2. The memory system of claim 1, wherein
the first list includes a set of logical addresses that is a remainder of excluding a first set of logical addresses from a second set of logical addresses, the second set of logical addresses including logical addresses corresponding respectively to data that have been received from the host and are to be written to the first write destination block, and the first set of logical addresses including logical addresses corresponding respectively to data that have been written to the first write destination block and have become readable from the first write destination block.

3. The memory system of claim 1, wherein
the plurality of logical addresses included in the first list are arranged in a same order as an order in which the write-uncompleted data are written to the write-uncompleted region.

4. The memory system of claim 1, wherein
the controller is further configured to:
provide, after power to the memory system is restored, the first list stored in the nonvolatile memory to the host as information indicating data lost due to the power loss.

5. The memory system of claim 1, wherein
the controller is further configured to:
manage a mapping between each of logical address used by the host to access the memory system and each of physical addresses of the nonvolatile memory using a logical-to-physical translation table; and after power to the memory system is restored, store a value indicating an error in an entry of the logical-to-physical translation table corresponding to each of the plurality of logical addresses included in the first list, based on the first list stored in the nonvolatile memory.

6. The memory system of claim 1, wherein
the controller is further configured to:
manage a set of first blocks and a set of second blocks;
control writing to the set of first blocks in a first mode when the power loss occurs, the first mode being a mode in which the controller backs up a list of logical addresses corresponding respectively to write-uncompleted data which have been received from the host and have not been written to the nonvolatile memory; and
control writing to the set of second blocks in a second mode when the power loss occurs, the second mode being a mode in which the controller completes writing of the write-uncompleted data to the nonvolatile memory.

7. The memory system of claim 1, wherein
the first storage location information includes a block address of the first write destination block and an offset from a storage location at a beginning of the first write destination block to a storage location at a beginning of the write-uncompleted region.

8. The memory system of claim 1, wherein
the first write destination block is a block group including a plurality of physical blocks.

9. A memory system connectable to a host, comprising:
a nonvolatile memory including a plurality of blocks;
a capacitor storing power to be supplied to the memory system; and
a controller electrically connected to the nonvolatile memory and configured to control the nonvolatile memory, wherein
the controller is configured to:
allocate one of the plurality of blocks as a first write destination block;
when a write command specifying a logical address is received from the host, store data associated with the write command in an internal buffer;
add a set of logical addresses corresponding respectively to the data stored in the internal buffer, to a first list for storing a plurality of logical addresses corresponding respectively to write-uncompleted data that have been received from the host and have not been written to the first write destination block;
when a size of unwritten data stored in the internal buffer reaches a write size of the nonvolatile memory, write data having the write size to the first write destination block;
delete, in a case where the data having the write size becomes readable from the first write destination block, a set of logical addresses corresponding to the readable data from the first list, and advance a storage location indicated by a first storage location information by the write size so that the first storage location information indicates a storage location at a beginning of a write-uncompleted region of the first write destination block; and
in a case where a power loss occurs in which supply of power to the memory system is shut off without notice from the host, write the first list and the first storage location information to the nonvolatile memory using power from the capacitor.

10. The memory system of claim 9, wherein
the plurality of logical addresses in the first list are arranged in a same order as an order in which the write-uncompleted data are written to the write-uncompleted region.

11. The memory system of claim 9, wherein
the controller is further configured to:
provide, after power to the memory system is restored, the first list stored in the nonvolatile memory to the host as information indicating data lost due to the power loss.

12. The memory system of claim 9, wherein
the controller is further configured to:
manage mapping between each of logical addresses used by the host to access the memory system and each of physical addresses of the nonvolatile memory using a logical-to-physical translation table; and
after power to the memory system is restored, store a value indicating an error in an entry of the logical-to-physical translation table corresponding to each of the plurality of logical addresses included in the first list, based on the first list stored in the nonvolatile memory.

13. The memory system of claim 9, wherein
the controller is further configured to:
manage a set of first blocks and a set of second blocks;
control writing to the set of first blocks in a first mode when the power loss occurs, the first mode being a mode in which the controller backs up a list of logical addresses corresponding respectively to write-uncompleted data which have been received from the host and have not been written to the nonvolatile memory; and
control writing to the set of second blocks in a second mode when the power loss occurs, the second mode being a mode in which the controller completes writing of the write-uncompleted data to the nonvolatile memory.

14. The memory system of claim 9, wherein
the first storage location information includes a block address of the first write destination block and an offset from a storage location at the beginning of the first write destination block to the storage location at the beginning of the write-uncompleted region.

15. A method of controlling a memory system that includes a nonvolatile memory including a plurality of blocks, comprising:
allocating a block of the plurality of blocks as a first write destination block;
when a write command specifying a logical address is received from a host, storing data associated with the write command in an internal buffer of the memory system;
adding a set of logical addresses corresponding respectively to the data stored in the internal buffer, to a first list for storing a plurality of logical addresses corresponding respectively to write-uncompleted data that have been received from the host and have not been written to the first write destination block;
when a size of unwritten data stored in the internal buffer reaches a write size of the nonvolatile memory, writing data having the write size to the first write destination block;
deleting, in a case where the data having the write size becomes readable from the first write destination block, a set of logical addresses corresponding to the readable data from the first list, and advancing a storage location indicated by a first storage location information by the write size so that the first storage location information indicates a storage location at a beginning of a write-uncompleted region of the first write destination block; and in a case where a power loss occurs in which supply of power to the memory system is shut off without notice from the host, writing the first list and the first storage location information to the nonvolatile memory using power from a capacitor that stores power to be supplied to the memory system.

16. The method of claim 15, wherein
the plurality of logical addresses in the first list are arranged in a same order as an order in which the write-uncompleted data are written to the write-uncompleted region.

17. The method of claim 15, further comprising:
providing, after power to the memory system is restored, the first list stored in the nonvolatile memory to the host as information indicating data lost due to the power loss.

18. The method of claim 15, further comprising:
managing mapping between each of logical addresses used by the host to access the memory system and each of physical addresses of the nonvolatile memory using a logical-to-physical translation table; and after power to the memory system is restored, storing a value indicating an error in an entry of the logical-to-physical translation table corresponding to each of the plurality of logical addresses included in the first list, based on the first list stored in the nonvolatile memory.

19. The method of claim 15, further comprising:
managing a set of first blocks and a set of second blocks;
controlling writing to the set of first blocks in a first mode when the power loss occurs, the first mode being a mode that backs up a list of logical addresses corresponding respectively to write-uncompleted data which have been received from the host and have not been written to the nonvolatile memory; and
controlling writing to the set of second blocks in a second mode when the power loss occurs, the second mode being a mode that completes writing of the write-uncompleted data to the nonvolatile memory.

20. The method of claim 15, wherein
the first storage location information includes a block address of the first write destination block and an offset from a storage location at the beginning of the first write destination block to the storage location at the beginning of the write-uncompleted region.

* * * * *